(12) United States Patent
Guo et al.

(10) Patent No.: US 11,354,383 B2
(45) Date of Patent: Jun. 7, 2022

(54) SUCCESSIVE BIT-ORDERED BINARY-WEIGHTED MULTIPLIER-ACCUMULATOR

(71) Applicant: Applied Materials, Inc., Santa Clara, CA (US)

(72) Inventors: Frank Tzen-Wen Guo, Danville, CA (US); She-Hwa Yen, Mountain View, CA (US)

(73) Assignee: Applied Materials, Inc, Santa Clara, CA (US)

( * ) Notice: Subject to any disclaimer, the term of this patent is extended or adjusted under 35 U.S.C. 154(b) by 374 days.

(21) Appl. No.: 16/688,782

(22) Filed: Nov. 19, 2019

(65) Prior Publication Data

US 2021/0097131 A1   Apr. 1, 2021

Related U.S. Application Data

(60) Provisional application No. 62/907,419, filed on Sep. 27, 2019.

(51) Int. Cl.
*G06F 17/16* (2006.01)
*H03M 1/46* (2006.01)
*G06F 7/544* (2006.01)

(52) U.S. Cl.
CPC ............ *G06F 17/16* (2013.01); *G06F 7/5443* (2013.01); *H03M 1/466* (2013.01)

(58) Field of Classification Search
CPC ...... G06F 17/16; G06F 5/5443; H03M 1/466; H03M 1/66
USPC .................................................. 708/607, 835
See application file for complete search history.

(56) References Cited

U.S. PATENT DOCUMENTS

| 10,235,343 | B2 | 3/2019 | Dourbal |
| 2004/0243657 | A1 | 12/2004 | Goren et al. |
| 2017/0228345 | A1 | 8/2017 | Gupta et al. |
| 2018/0004708 | A1 | 1/2018 | Muralimanohar et al. |
| 2018/0173677 | A1 | 6/2018 | Muralimanohar |
| 2019/0065151 | A1 | 2/2019 | Chen et al. |
| 2019/0080230 | A1 | 3/2019 | Hatcher et al. |

(Continued)

FOREIGN PATENT DOCUMENTS

| CN | 110263296 A | 9/2019 |
| TW | 201802666 A | 1/2018 |
| TW | I713047 B | 12/2020 |

OTHER PUBLICATIONS

International Search Report and Written Opinion dated Dec. 23, 2020 in International Patent Application No. PCT/US2020/052161, 6 pages.

(Continued)

*Primary Examiner* — Tan V Mai
(74) *Attorney, Agent, or Firm* — Kilpatrick Townsend & Stockton LLP

(57) ABSTRACT

Various arrangements for performing successive vector-matrix multiplication may include sequentially performing a first vector-matrix multiplication operation for each bit-order of values in an input vector. The first vector-matrix multiplication operation for each bit-order may generate an analog output. For each analog output generated by the vector-matrix multiplication operation, an analog output may be converted into one or more digital bit values, and the one or more digital bit values may be sent to a second vector-matrix multiplication operation.

20 Claims, 11 Drawing Sheets

(56) References Cited

U.S. PATENT DOCUMENTS

2020/0081711 A1* 3/2020 Bayat ................. G06F 9/3001
2021/0365765 A1* 11/2021 Kim .................... G06N 3/08

OTHER PUBLICATIONS

International Search Report and Written Opinion dated Aug. 6, 2020 in International Patent Application No. PCT/US2020/029326, 9 pages.

Lee, E.H., et al., "Analysis and Design of a Passive Switched-Capacitor Matrix Multiplier for Approximate Computing", arXiv:1612.00933v1, Dec. 3, 2016, pp. 1-34 [retrieved on Jul. 15, 2020], Retrieved from https://arxiv.org/abs/1612.00933.pdf.

International Preliminary Report on Patentability dated Nov. 18, 2021 in International Patent Application No. PCT/US2020/029326, 7 pages.

International Preliminary Report on Patentability dated Apr. 7, 2022 in International Patent Application No. PCT/US2020/052161, 4 pages.

* cited by examiner

SUCCESSIVE BIT-ORDERED BINARY-WEIGHTED MULTIPLIER-ACCUMULATOR

CROSS-REFERENCES TO RELATED APPLICATIONS

This application claims the benefit of U.S. Provisional Application No. 62/907,419, filed Sep. 27, 2019, which is herein incorporated by reference in its entirety for all purposes.

BACKGROUND

A vector-matrix multiplication operation can be defined as the sum of a product of a vector and a matrix. Specifically, Equation 1 can be used to define a vector-matrix multiplication operation in which the product is summed.

$$Y = \sum_i W_{ij} X_i \qquad \text{Eq. 1}$$

In Equation 1, $X_i$ is an input vector composed of values (which can be represented in an electronic environment using binary bits) and $W_{ij}$ represents matrix weighting values. Y is the output vector obtained by summing the product vector. This function has applications in various signal processing, image processing, and artificial intelligence applications, such as in the use of neural-networks.

Performing this equation, when performed digitally, can consume a significant amount of processing resources and/or energy. Conventional analog componentry or digital and analog hybrid componentry can require a relatively large number of clock cycles, and/or a relatively large area of space to implement.

SUMMARY

In some embodiments, a method for performing a successive binary-weighted digital-to-analog conversion may include sequentially performing a first vector-matrix multiplication operation for each bit-order of values in an input vector, where the first vector-matrix multiplication operation for each bit-order may generate an analog output. The method may also include for each analog output generated by the vector-matrix multiplication operation, converting the analog output into one or more digital bit values and sending the one or more digital bit values to a second vector-matrix multiplication operation.

In some embodiments, a vector-matrix multiplier circuit may include a plurality of digital inputs, where each digital input may receive a binary-encoded input value of an input vector. The circuit may also include a vector matrix multiplier circuit that performs binary-encoded vector multiplication operations on a single bit-order at a time using the binary-encoded input value. The circuit may further include a successive binary-weighted analog-to-digital converter that sequentially receives analog outputs from the vector matrix multiplier circuit and sequentially converts each of the analog outputs into one or more digital bit values.

In some embodiments, an apparatus for performing vector-matrix multiplication may include a means for receiving a plurality of digital inputs, where each digital input may receive a binary-encoded input value of an input vector. The apparatus may also include a means for sequentially performing a vector-matrix multiplication operation for each bit-order of a plurality of input vector values, where the vector-matrix multiplication operation for each bit-order may generate an analog output. The apparatus may further include a means for converting each of the analog outputs into one or more digital bit values.

In any embodiment, any or all of the following features may be included in any combination and without limitation. The first vector-matrix multiplication operation may be performed beginning with a most significant bit (MSB) of each of the values in the input vector and ending with a least significant bit (LSB) of each of the values in the input vector. Converting the analog output into one or more digital bit values may include comparing the analog output to a reference signal, where a first digital bit value in the one or more digital bit values may represent a logic 1 when the analog output is greater than the reference signal, and where the first digital bit value may represent a logic 0 when the analog output is less than the reference signal. Converting the analog output into one or more digital bit values may further include adjusting the reference signal when the first digital bit value represents a logic 1. The analog output may correspond to an MSB of each of the values in the input vector, and the one or more digital bit values may comprise the first digital bit value without a carryover bit. Converting the analog output into one or more digital bit values may further include comparing the analog output to the reference signal after the reference signal is adjusted, where a second digital bit value in the one or more digital bit values may represent a logic 1 when the analog output is greater than the reference signal, and where the second digital bit value may represent a logic 0 when the analog output is less than the reference signal. The first digital bit value may represent a value corresponding to a current analog output, and the second digital bit value may represent a carryover value to be added to a value corresponding to a previous analog output. Converting the analog output into one or more digital bit values may further include maintaining the reference signal when the first digital bit value represents a logic 0. Converting the analog output into one or more digital bit values may further include comparing the analog output to the reference signal after the reference signal is adjusted, where a second digital bit value in the one or more digital bit values may represent a logic 1 when the analog output is greater than the reference signal, and where the second digital bit value may represent a logic 0 when the analog output is less than the reference signal. There may be a two cycle delay between converting the analog output into the one or more digital bit values and sending the one or more digital bit values to the second vector-matrix multiplication operation. The successive binary-weighted analog-to-digital converter may also include a charge integration circuit with a capacitor on which each of the analog outputs stores charge on the capacitor. The vector matrix multiplier circuit may also pass an indication of a current bit-order. The vector-matrix multiplier circuit may also include a multiplexor that sends the one or more digital bit values to one of a plurality of registers, where the indication of a current bit-order may control the multiplexor. The successive binary-weighted analog-to-digital converter may also include a plurality of binary-weighted switches and capacitors that each store different ones of the analog outputs. The circuit/apparatus may further include a successive binary-weighted analog-to-digital converter that sequentially receives analog outputs from the means for sequentially performing a vector-matrix multiplication operation, and sequentially converts each of the analog outputs into at least on digital bit value. The apparatus may also include a means for converting the plurality of digital inputs into a plurality of analog signals that are input into the means for sequentially performing a vector-matrix multiplication operation. The apparatus may also include a voltage reference to which the analog output is compared. The apparatus may also include a means for comparing the voltage reference to the analog output.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
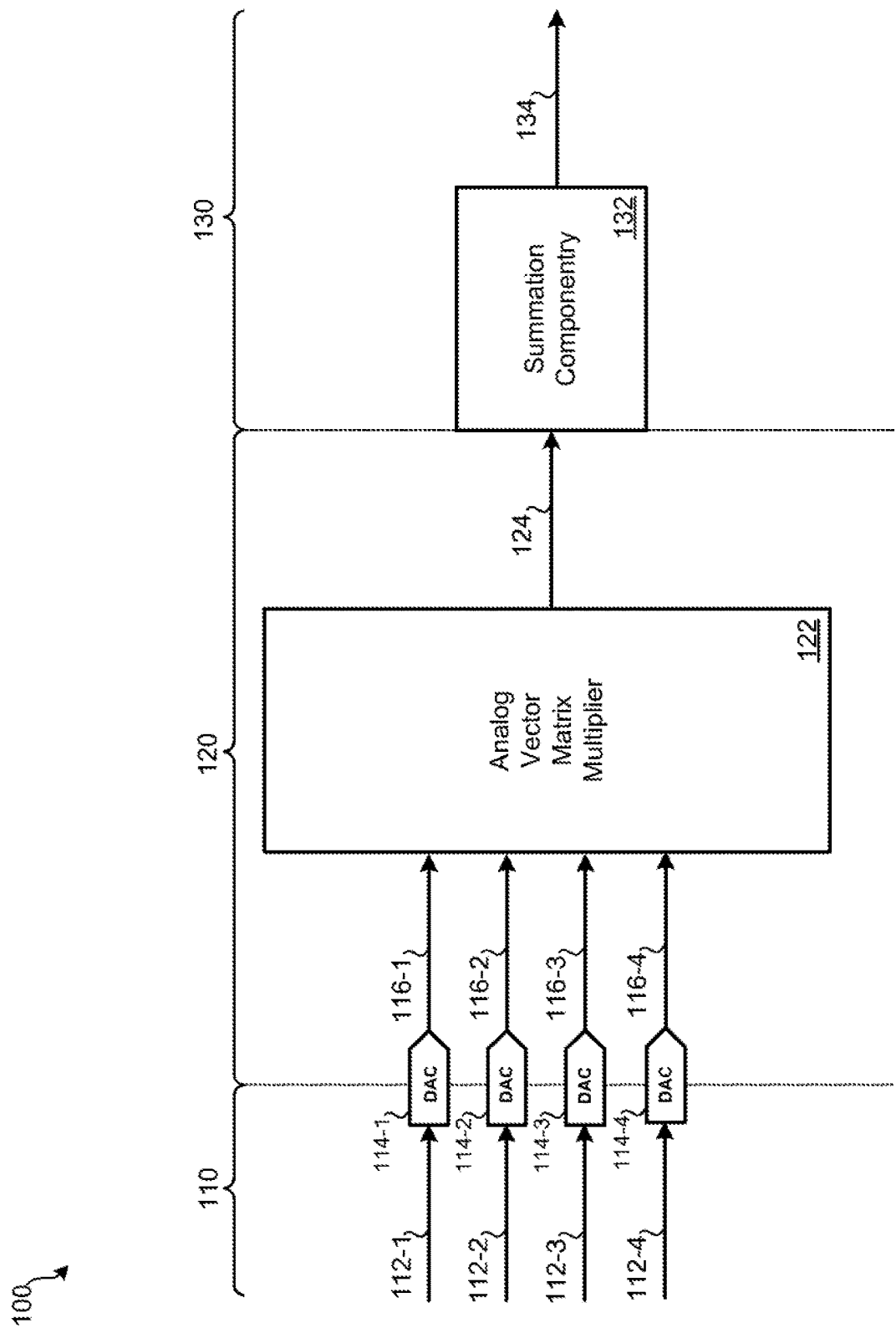
FIG. 1 illustrates an embodiment of a vector-matrix multiplier circuit in which vector multiplication is performed using analog components to bit-ordered binary values.

Embodiments detailed herein allow for multiplier accumulator (MAC) operations to be performed during a shorter amount of time (e.g., fewer clock cycles) compared to conventional analog embodiments and do not require digital input signals to be decoded. Rather, input vectors in the form of binary encoded (or "bit-ordered") values can be received. Such values are typically arranged from LSB to MSB or MSB to LSB (e.g., "1110", representing a value of 14) and can be multiplied in the analog domain then summed in the analog or digital domain. Arrangements detailed herein are performed directly on analog conversions of binary encoded values and do not require the input vectors to be converted to a series of pulses (e.g., fourteen pulses to represent a value of 14). Thus, computation can be performed significantly quicker than conventional analog arrangements. More specifically, the number of operation cycles to perform vector-matrix multiplication can be reduced by $$\frac{2^{Nbit}}{Nbit + 2}$$

times. In this equation, the additional 2 cycles indicated in the denominator can vary by implementation. For example, embodiments detailed herein can perform vector-matrix multiplication for 8-bit input vectors that may be sped up 25.6 times as compared to conventional analog MAC designs.

Further, the arrangements detailed herein may have significant space savings over conventional analog MAC designs. By using one bit digital-to-analog converters (DACs), less area may be needed than if multi-bit DACs that convert a binary value received in parallel are used. Specifically, multiple one bit DACs may be used to convert binary-encoded input vectors to binary-encoded analog voltage values in parallel. For instance, for four bit input vectors, four clock cycles may be needed to output the binary-encoded analog voltage value from the one-bit DAC (one cycle for LSB, one cycle for second LSB, one cycle for second MSB, one cycle for MSB). The number of one-bit DACs may be dependent on the number of input vectors ($X_i$ in Equation 1).

Matrix multiplication operations may be performed sequentially for each bit-order of the input vector's values at a time. The parallel output of each one-bit DAC may be input to weighting components of a vector matrix multiplier circuit. The vector matrix multiplier circuit may have various weighting components that correspond to the $W_{ij}$ matrix of Equation 1 with which $X_i$ is being multiplied. The vector matrix multiplier circuit may perform multiplication operations for each bit-order of the input vectors. Therefore, if the input vector contains values four bits in length, the vector matrix multiplier circuit may perform multiplication operations for each of the four bit-orders sequentially in the time domain. The output from the vector matrix multiplier circuit may be sequential signals (e.g., that have a current or some of electrical characteristic indicative of a multiplication result) that are output to a summation circuit.

The summation circuit may function to perform a bit-order weighted summation after the matrix multiplication operations have been performed. The summation circuit may function in either the analog or digital domain. The summation circuit may receive signals from the vector matrix multiplication circuit, store indications of each matrix multiplication operation in such a way that it is weighted for the proper bit-order, and perform a summation to determine the output value Y.

FIG. 1 illustrates an embodiment of a circuit 100 in which vector multiplication is performed using analog components on binary-encoded inputs. Circuit 100 can include: one-bit DACs 114; analog vector matrix multiplier 122; and summation componentry 132. Circuit 100 can be understood as divided into three sections. Section 110 receives binary-encoded digital signals (which represent an input vector) and converts the binary-encoded digital signals to binary-encoded analog signals. Section 120 receives binary-encoded analog signals and outputs binary-encoded products indicative of multiplication between the binary-encoded analog signals and a pre-defined matrix (e.g., a weighting matrix). Section 130 performs a bit-order weighted summation to sum the binary-encoded products and take into account the bit-order weighting of the binary-encoded signals. Therefore, the proper bit-orders of each bit of the binary-encoded input signals is maintained such that the summation can be determined properly. Section 130 may use analog componentry to efficiently sum the product outputs of section 120. Section 130 may also function in the digital domain.

Specifically, in section 110, multiple digital input signals 112 may be received in parallel. Digital input signals 112 represent binary-encoded values and each digital input signal of digital input signals 112 can represent a value of the vector $X_i$ of Equation 1. The binary bits of input signals 112 may be represented by voltage levels (e.g., high for one, low for zero), pulses (e.g., a pulse for one, no pulse for zero) or time (e.g., a pulse of a first duration for one, a pulse of a second duration for zero). As illustrated, four digital input signals (112-1, 112-2, 112-3, and 112-4) may be received in parallel. Each of these input signals may receive a separate value of the input vector. In other embodiments, fewer or greater numbers of digital input signals may be received than specifically illustrated in FIG. 1. Each of digital input signals 112 may be binary-encoded. Therefore, for each clock-cycle of the digital portion of the circuit, a bit for a particular bit-order may be received as digital input signals 112. For example, if four-bit binary values are being input via each digital input signal 112, four clock cycles may be used for each bit of the binary values to be received and converted to the analog domain in parallel. The digital input signals 112 may be binary-encoded such that each value's bit-order is from least significant bit (LSB) to most significant bit (MSB), from MSB to LSB, or in an arbitrary, pre-defined pattern.

Digital input signals 112 may be input to one-bit DACs 114. Again here, as illustrated, four one-bit DACs 114 (114-1, 114-2, 114-3, and 114-4) are present. In other embodiments, fewer or greater numbers of one-bit DACs 114 may be present. A single one-bit DAC may be present for each binary-encoded digital input signal 112. Each of the one-bit DACs 114 may output an analog signal indicative of the digital value received. Therefore, binary-encoded analog signals 116 (116-1, 116-2, 116-3, 116-4) can represent analog translations of the digital input signals 112.

In section 120, analog vector matrix multiplier 122 may receive binary-encoded analog signals 116. Analog vector matrix multiplier 122 may sequentially perform multiplication operations on each bit-order of the input values (e.g., a first clock cycle for the LSBs, a second clock cycle for the second LSBs, a third clock cycle for the second MSB, etc.). Therefore, a separate multiplication operation may be performed for each bit-order of the received binary-encoded analog signals 116. Further details regarding possible embodiments of analog vector matrix multiplier 122 are provided below in relation to FIG. 2. Binary-encoded multiplication results signal 124 may be output to summation componentry 132.

Summation componentry 132 may be understood as performing bit-order weighted summation functionality. Summation componentry 132 may properly take into account the bit-order of the bits currently being evaluated by analog vector matrix multiplier 122, store the outputs such that the bit-order is taken into account, and perform a summation function. As detailed herein, bit-order weighting may be performed by summation componentry 132, thus allowing the input values to remain binary-encoded when evaluated by the vector matrix multiplication circuit.

In a possible analog embodiment of summation circuitry, charge accumulation and redistribution can be used to perform a passive bit-order weighted summation. As binary-encoded signals are received from analog vector matrix multiplier 122, summation componentry 132 may use charge accumulation to accumulate partial summations. Once all bit-orders (e.g., four bit-orders for an input vector having four bit values) have been multiplied by analog vector matrix multiplier 122, and summation componentry 132 has stored partial summations such as using charge accumulation, the charge may be redistributed and a voltage representative of a final summation value may be output. Further detail regarding a possible embodiment of an analog implementation of summation componentry 132 is presented below in FIG. 3.

Figure 2:
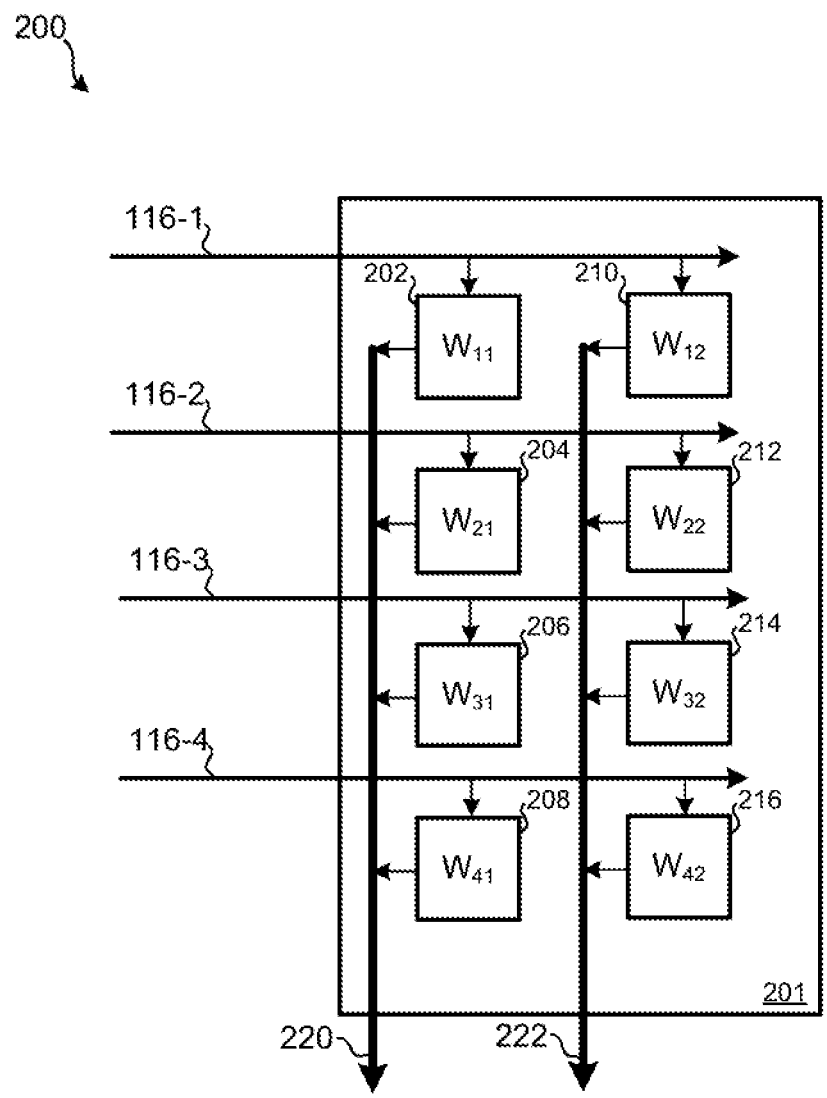
FIG. 2 illustrates an embodiment of an analog vector matrix multiplier.

FIG. 2 illustrates an embodiment 200 of an analog vector matrix multiplier that evaluates a single bit-order of an input vector that has been converted to analog. Analog vector matrix multiplier 201 may represent an embodiment of analog vector matrix multiplier 122 of FIG. 1. However, it should be understood that embodiment 200 is only an example. In FIG. 2, the binary vector input $X_i$ is to be multiplied with $W_{ij}$. Analog vector matrix multiplier 201 may include multiple weighting elements (202, 204, 206, 208, 210, 212, 214, and 216). Each weighting element may receive a binary-encoded analog signal of binary-encoded analog signals 116 from a one-bit DAC. In this example, the weighting element may output a current based on the voltage of its received binary-encoded analog signal and a weighting value of the particular weighting element. For instance, each weighting element may be implemented using various conductances. By varying the conductances of the weighting components, the amount of current output depending on the input voltage can be varied. For instance, if the voltage is 1 V, and the conductance of a weighting block is 8 μS, an output of 8 μA may be obtained. This value may further be weighted based on the bit-order of the value. Therefore, for the least significant bit, the multiplier would be 1, for the second LSB, the multiplier would be 2, and so on. In some embodiments, the weightings used by each weighting element may be predetermined and fixed at manufacture. In other embodiments, the weighting of each weighting element may be configurable after manufacture and reconfigurable during use of embodiment 200.

The output of each weighting element (202, 204, 206, 208, 210, 212, 214, and 216) can be an electrical characteristic, such as current. The currents output from the weighting elements connected to a same current output may be summed together. Therefore, current output 220 may include the sums of the current output by weighting elements 202, 204, 206, and 208; and current output 222 may include the sums of the current output by weighting elements 210, 212, 214, and 216.

A single bit of each value of the input vector is evaluated at a time (and bit-order is not taken into account by analog vector matrix multiplier 201). For example, for an input vector having four four-bit values, the MSB of each value may be evaluated first, followed by the second MSB of each value, followed by the second LSB, and finally followed by the LSB of each value (thus corresponding to four clock cycles of binary-encoded data output by the one-bit DACs). In other embodiments, evaluation may proceed from LSB to MSB or in any other predefined, arbitrary order. As detailed later in this document, the output of analog vector matrix multiplier 201 may be weighted by the summation circuitry to take into account the bit-order of the bits to which the multiplication operation is being performed by the vector matrix multiplier.

The number of columns of weighting elements is arbitrary and can be based on the weighting matrix with which the input vector is being multiplied. Therefore, while two columns are present in embodiment 200, fewer or a greater number of columns may be present in other elements. The number of rows of weighting elements may correspond to the number of values present in the input vector. For example, equation 2 can represent the current output by analog vector matrix multiplier 201:

$$I_{out_i} = \sum_{j=1}^{4} v_j * w_{ji}, i = 1 \ldots n \qquad \text{Eq. 2}$$

Continuing with the example, current outputs (e.g., current outputs 220, 222) may be connected together to create a binary-encoded multiplication result signal 124. Summation componentry 132 properly weights, stores, then sums each bit-order to obtain a correct final summation.

Figure 3:
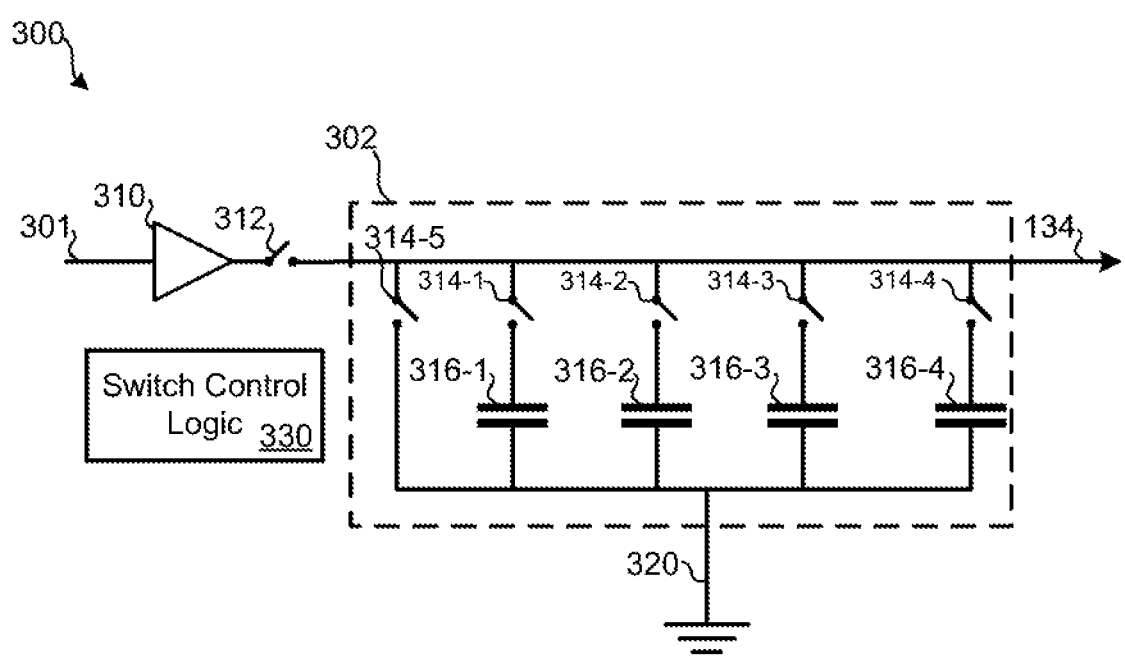
FIG. 3 illustrates an embodiment of an analog summation circuit.

FIG. 3 illustrates an embodiment 300 of an analog summation circuit. It should be understood that various different types of circuits may be used to accumulate and redistribute signals that may be in the form of voltage, current, charge or some other electrical characteristic. A key aspect of the analog summation circuit is that it applied the proper bit-weighting to received outputs of the analog vector matrix multiplier 201. For example, when an output corresponding to the second LSB of the input vector is output by the analog vector matrix multiplier 201, analog summation circuit applies a bit-weighting that is double that of the LSB and half of the third LSB. Embodiment 300 can represent summation componentry 132 of FIG. 1. Input 301 represents the binary-encoded multiplication result signal 124 from the analog vector matrix multiplier. Input 301 feeds to sense amplifier 310. Sense amplifier 310 outputs a voltage based on the current received on input 301 by sense amplifier 310. Specifically, embodiment 300 can use passive charge sharing and redistribution. Such an arrangement can help decrease power consumption and decrease the effect of thermal noise on the output value.

Embodiment 300 comprises a capacitor-switch array 302. The capacitors can be bit-order weighted, meaning that each capacitor's capacitance may be selected to passively store an amount of charge that is weighted for a particular bit-order. As an example, to output a four-bit value, four capacitors are present. Capacitor 316-1 may be used to store charge corresponding to the LSB. Therefore, capacitor 316-1 can have a capacitance of C (where C is the unit value). Capacitor 316-2 may be used to store charge corresponding to the second LSB. Therefore, capacitor 316-2 can have a capacitance of 2C (which represents double the weight as C, thus corresponding to the second LSB in a binary bit-order). Capacitor 316-3 may be used to store charge corresponding to the second MSB. Therefore, capacitor 316-3 can have a capacitance of 4C. Capacitor 316-4 may be used to store charge corresponding to the MSB. Therefore, capacitor 316-4 can have a capacitance of 8C. Each capacitor has a capacitance corresponding to the bit-order for which it will be used to store charge indicative of the output of the analog vector matrix multiplier. The capacitance can be calculated according to Equation 3, where C is the unit value and N is the number of bits in the values of the input vector.

$$\text{Capacitance} = 2^{N-1}C \qquad \text{Eq. 3}$$

Switch control logic 330, which can be digital and connected with the same clock as section 110, can control whether switches 312, 314-1, 314-2, 314-3, 314-4, and 314-5 are open or closed. For simplicity, in FIG. 3, communication between switch control logic 330 and switches 312 and 314 are not illustrated. Switch control logic 330 may be dedicated logic circuitry or may be incorporated as part of a processing system. Switch control logic 330 may initially close switches 314-1, 314-2, 314-3, 314-4, and 314-5, while switch 312 is open. Switch 314-5 may function as a reset, causing charge present in capacitors 316-1, 316-2, 316-3, and 316-4 to discharge to ground 320.

Switch control logic 330 may then control the switches such that the capacitor having the capacitance associated with the current bit-order being evaluated by analog vector matrix multiplier 122 is connected to binary-encoded multiplication result signal 124. Switch control logic 330 may close switch 312 and open switches 314-2, 314-3, 314-4, and 314-5. Therefore, only switch 314-1 may remain closed, thus connecting capacitor 316-1 to an output of sense amplifier 310. During this clock cycle, analog vector matrix multiplier 122 may be outputting a binary-encoded multiplication results signal corresponding to the LSB. For the next clock cycle, switch control logic 330 may keep switch 312 closed, open switch 314-1, and close switch 314-2. During this clock cycle, analog vector matrix multiplier 122 may output a binary-encoded multiplication results signal corresponding to the second LSB. By virtue of capacitor 316-2 having double the capacitance of capacitor 316-1, the proper bit weighting is passively applied in the amount of charge stored. For the next clock cycle, switch control logic 330 may keep switch 312 closed, open switch 314-2, and close switch 314-3. During this clock cycle, analog vector matrix multiplier 122 may output a binary-encoded multiplication results signal corresponding to the second MSB. By virtue of capacitor 316-3 having double the capacitance of capacitor 316-2, the proper bit weighting is passively applied in the amount of charge stored. For the next clock cycle, switch control logic 330 may keep switch 312 closed, open switch 314-3, and close switch 314-4. During this clock cycle, analog vector matrix multiplier 122 may output a binary-encoded multiplication results signal corresponding to the MSB. By virtue of capacitor 316-4 having double the capacitance of capacitor 316-3, the proper bit weighting is passively applied by the amount of charge stored. At this stage, switched capacitor-switch array 302 stores the binary-encoded multiplication results separately as charge in the bit-order weighted capacitors.

At this point, each of capacitors 316-1, 216-2, 316-3, and 316-4 stores an amount of charge (Q) corresponding to the capacitors' particular bit-order. The amount of charge stored on a particular capacitor, for a given bit-order N, can be defined by Equation 4.

$$Q = 2^{N-1} * C * V \qquad \text{Eq. 4}$$

Therefore, the amount of charge is equal to a capacitor's capacitance multiplied by the voltage output by sense amplifier 310. As detailed in relation to Equation 3, the capacitance is increased by a factor of $2^{N-1}$ for each greater bit-order.

During a next clock cycle, switch control logic 330 may open switch 312, keep switch 314-5 open, and close switches 314-1, 314-2, 314-3, and 314-4. This step may be understood as a charge redistribution step. Since each capacitor stores an amount of charge corresponding to its bit-order, during the charge redistribution stage, the charge in each individual capacitor is distributed among capacitors 316-1, 316-2, 316-2, and 316-3 and is indicative of the final summation. Once redistribution has occurred, the summation is represented as a voltage value at the top plates of capacitors 316, which is output via summation output 134. Equation 5 represents the voltage value that will be output via summation output 134 based on the charge stored in each capacitor.

$$V_{Out} = \frac{Q_1 + Q_2 + Q_3 + \ldots Q_N}{(2^N - 1) * C}$$ Eq. 5

In Equation 5, the charge of each capacitor contributes an appropriate weighted amount based on the capacitor's associated bit-order to $V_{Out}$ as summation output 134, which represents the final weighted sum of the analog vector-matrix multiplication.

In total, for when the input vector includes four-bit values, the summation process may take six clock cycles until a valid summation output 134 is output. Stated more generally, the summation process can require a reset clock cycle, a redistribution clock cycle, and a clock cycle for each bit of the value.

While FIG. 3 illustrates four capacitors, it should be understood that this embodiment is for example purposes only. The number of capacitors may be increased or decreased to accommodate a different number of bits for values of the input vector. In an alternate embodiment, differential summation circuitry may be implemented such that common mode interference can be canceled out from summation output 134. Further, other embodiments may use alternate passive analog components to store and sum charge to determine summation output 134. In still other embodiments, summation circuitry may be implemented using digital circuitry.

Figure 4:
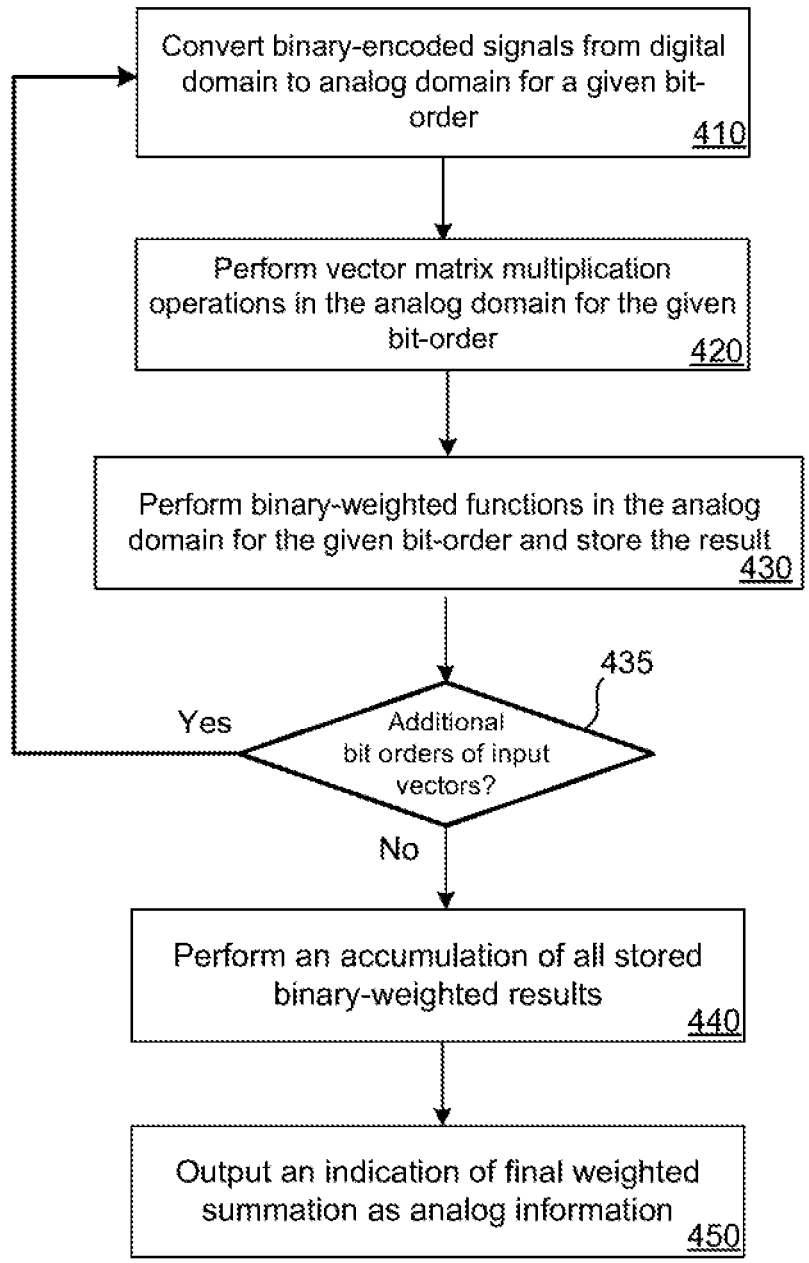
FIG. 4 illustrates an embodiment of a method for performing a vector-matrix multiplication operation.

Various methods may be performed using the systems and circuits detailed in FIGS. 1-3. FIG. 4 illustrates an embodiment of a method 400 for performing a vector-matrix multiplication operation. Method 400 may be performed using the circuits of FIGS. 1-3 or with alternate versions of such circuits. That is, it should be understood that the specific examples of circuits, such as those in FIGS. 2 and 3, are examples of how the circuit of FIG. 1 and the method of FIG. 4 can be implemented. In some embodiments, a digital summation circuit may be used.

At block 410, a bit-order of binary-encoded signals may be converted to binary-encoded analog signals. To perform this function, multiple one-bit DACs may be used in parallel. Therefore, each DAC may convert a digital signal to an analog signal for a given bit-order in parallel. Each DAC may receive a binary-encoded digital signal that is indicative of a particular bit-order for an input vector. Each vector may have N bits. Therefore, for the one-bit DACs to convert the binary-encoded digital signals to analog signals may take N clock cycles. For example, if the binary-encoded digital signal is "10011," it may take five clock cycles for this binary-encoded value (which represents a value of 19 assuming the right-most digit is the LSB) to be output by a one-bit DAC. The analog voltage output by each one-bit DAC may be dependent on a power voltage provided to each one-bit DAC.

At block 420, vector matrix multiplication is performed sequentially for the bit-order of the received binary-encoded analog signals. Block 420 may be performed for the particular bit-order of the input vectors received from the one-bit DACs. That is, block 420 may first be performed for each LSB of the values of the input vector (then, during a next iteration of block 420, the second LSB may be evaluated). Typically, the first bit evaluated would be either the MSB or LSB of the values of the input vector. Vector matrix multiplication may be performed by a circuit similar to embodiment 200 of FIG. 2. It should be understood that other embodiments of analog multiplication circuits are possible. The vector matrix multiplication multiplier may include weighting components that each cause a weighted amount of current indicative of the product of the analog input value and the weighting. Such currents, or some other electrical characteristic, may be output to summation circuitry.

At block 430, for the given bit-order for which vector matrix multiplier performed multiplication functions at block 420, the output of the vector matrix multiplier (which may be in the form of current or voltage) may be stored with a proper bit-order weighting. An indication of the received signal is weighted according to the bit-order of the bits evaluated by the analog vector matrix multiplier and stored. For instance, if evaluation by the analog vector matrix multiplier is performed from LSB to MSB, each subsequent bit may be afforded double the weight when stored by the summation circuit as compared to the previous bit. By way of example only, a sense amplifier may translate the received current from the analog vector matrix multiplier into a voltage. In some examples of a summation circuit, the voltage may be used to charge a particular capacitor having a capacitance corresponding to the bit-order for which block 420 was performed. Therefore, for example, when the LSB is evaluated, the output of the analog matrix multiplier may be used to charge a capacitor having a capacitance of C; when the second LSB is evaluated, the output of the analog matrix multiplier may be used to charge a capacitor having a capacitance of 2C, and so on.

At block 435, if additional bit-orders are yet to be evaluated, method 400 may return to block 410 and be performed for the next bit-order of the input vector. Therefore, each bit-order is evaluated by the analog vector matrix multiplier sequentially and a corresponding output is sequentially stored by the summation circuit with weighting corresponding to its bit-order. If the multiplication operation has been performed on all bit-orders at block 420 and stored at block 430, method 400 can proceed to block 440. Therefore, if each value of an input vector has four bits, blocks 420 and 430 are performed four times: once for each bit of the values.

At block 440, the summation may be determined, such as by performing an accumulation. In some embodiments, the summation is determined in the analog domain. The various bit-order weighted values stored at block 430 may be summed together. By way of example only, if a switch-capacitor array is used, the charge of capacitors may be redistributed among the capacitors, which serves to accumulate the total charge and is bit-weighted by virtue of the capacitance of each capacitor corresponding to a particular bit-order. To do this, a switch may be opened to isolate the switch-capacitor array and all switches directly connected to the capacitors (e.g., 314-1, 314-2, 314-3, and 314-4 of FIG. 3) may be closed. The charge of each capacitor can redistribute among the field of capacitors. The total amount of charge, however, will remain constant and will be properly bit-order weighted due to the difference in capacitance among the capacitors. In other embodiments, rather than using a capacitor array, another form of analog or digital circuit may be used to determine a final summation using the proper bit-orders of each multiplication result.

At block 450, an indication of the summation is output. In some embodiments, the indication of the summation is output as an analog electrical characteristic, such as a voltage magnitude. For example, a voltage at the top plate of a capacitor array as in FIG. 3 can represent the summation of the vector-matrix multiplication. This voltage can be measured and possibly used to determine a numerical value. For example, a separate circuit may use this output voltage, such as an ADC to convert the voltage back to the digital domain.

Successive MAC

In some embodiments, digitized MAC results may be available as soon the binary weighted MAC operation is completed. These embodiments may improve upon the bit-ordered binary-weighted multiplier-accumulator described above in FIGS. 1-4 in which MAC-digitized output data are available after eight MAC cycles and eight SAR ADC cycles for 8-bit wide data inputs. These embodiments make the MSB of the MAC data available at the end of the second cycle, and the rest of the seven MAC output bits may be available at the end of each successive cycle. This reduces the latency of the MAC operation eightfold.

In some embodiments, the ADC may be integrated inside the MAC. A successive MAC and ADC operation may be performed from the most significant bit to the least significant bit. At the end of each MAC cycle, one digitized MAC data bit may be available. The latency of this bit-ordered binary-weighted multiplier-accumulator is reduced because the data can be fed into the next layer of the multiplier-accumulator immediately. This then shortens the latency of each of the layers. By directly feeding the data to the next layer, no transfer back-and-forth from the MAC arrays and processor units is necessary, which can save power and reduce delay.

In some embodiments, the MAC may be performed from the most significant bit to the least significant bit. Consequently the integrated ADC and MAC can also operate from most significant to least significant bit. There may be difficulty involving residual analog data which is not digitized at higher bits, which can become carry-over bits at the least significant bits. Since the MAC most significant bits are output first, this carryover problem may be eliminated because the carry-over bits should not be added back to the most significant bits. Some embodiments solve this problem by producing two MAC output bits at the end of each MAC cycle. One bit may represent a carryover bit and one bit may represent a current bit. The carryover bit may have the same binary weight as one more significant bit. In this way, the carryover bit is not required to be shifted up to more significant bits. The MAC data for each binary bit may then be represented by two MAC data outputs. One may be the carryover from the next MAC cycle, and the other may be the current bit of a current MAC cycle. The next MAC layer can receive the two data bits with a proper weight assigned. The two data bits can be converted into an input data driver with triple levels. The input data level may be 2 if both carryover and current bits are 1. The input data level may be 1 if the single MAC data is 1, and the level may be 0 if none of the MAC data is 1.

Figure 5:
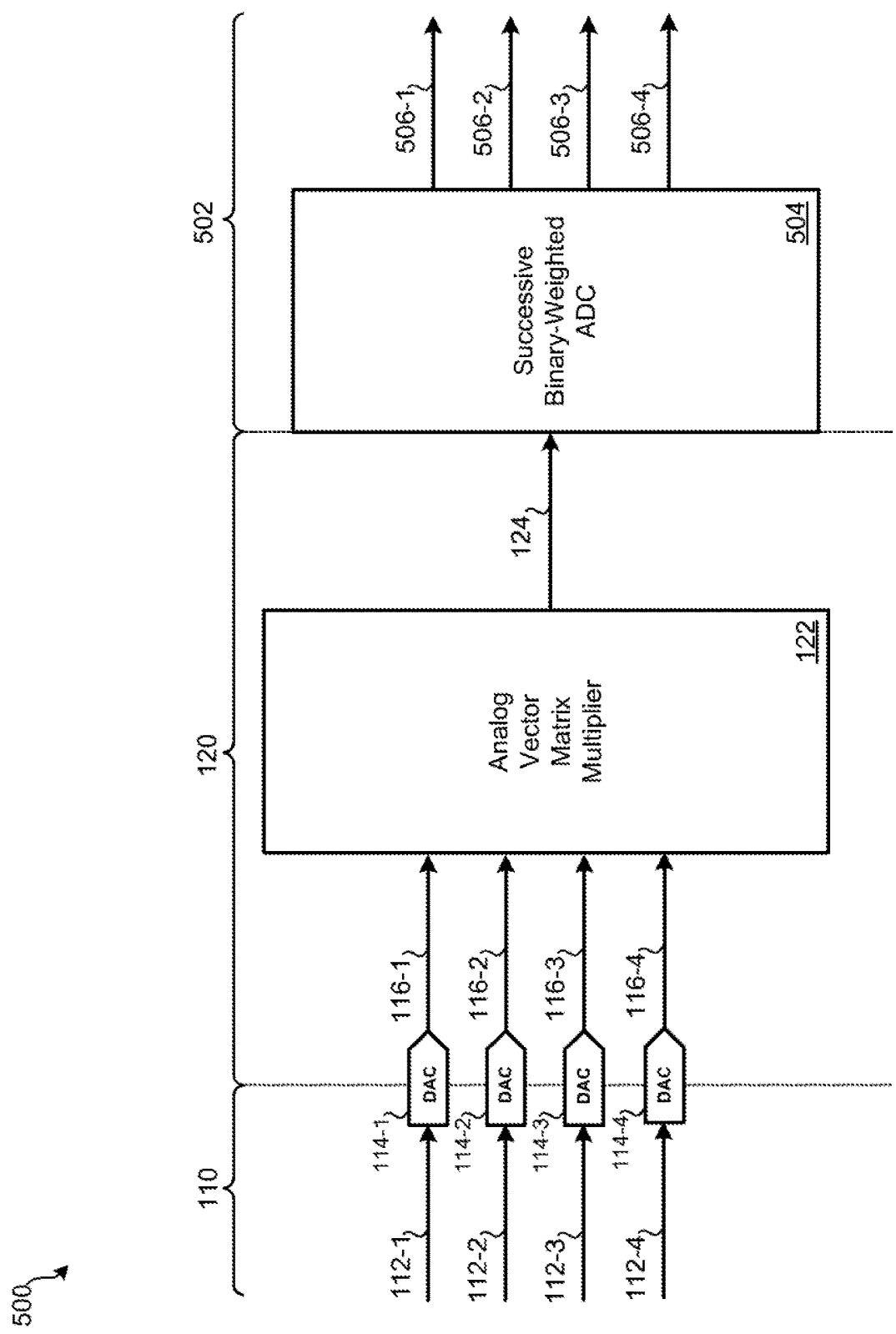
FIG. 5 illustrates an embodiment of a circuit in which vector multiplication is performed using analog components on binary-encoded inputs.

FIG. 5 illustrates an embodiment of a circuit 500 in which vector multiplication is performed using analog components on binary-encoded inputs. Circuit 500 is similar to circuit 100 in FIG. 1, the difference being that the output of the analog vector matrix multiplier 122 is directed into a successive binary-weighted ADC 504. As described above, circuit 100 may include: one-bit DACs 114; analog vector matrix multiplier 122; and summation componentry 132. Circuit 100 may still be understood as divided into three sections. Section 110 may receive binary-encoded digital signals, each of which may represent values in an input vector. Section 100 may also and convert the binary-encoded digital signals to binary-encoded analog signals 116. Section 120 may receive binary-encoded analog signals 116 and outputs binary-encoded products 124 indicative of multiplication between the binary-encoded analog signals and a pre-defined matrix (e.g., a weighting matrix). Section 502 may sequentially receive bit-ordered outputs from section 120 and incrementally perform a binary-weighted analog-to-digital conversion as individual bits are received from section 120. In some embodiments, the circuit 500 may use a pre-defined bit ordering where the MSB for each of the digital input signals 112 is received first, followed sequentially by the MSB-1 bit down to the LSB. Section 502 may sequentially provide a plurality of digital output signals 506 that are immediately available as they are processed by section 502. For example, one of the plurality of digital output signals 506 representing the MSB may be output, followed by one of the digital output signals 506 representing the MSB-1 bit, and so forth.

By way of example, multiple digital input signals 112 may be received in parallel by section 110. Digital input signals 112 may represent binary-encoded values and each digital input signal of digital input signals 112 may represent a value $X_i$ (i=0, 1, 2, . . . ) of the vector $X_i$ of Equation 1. The binary bits of input signals 112 may be represented by voltage levels (e.g., high for one, low for zero), pulses (e.g., a pulse for one, no pulse for zero) or time (e.g., a pulse of a first duration for one, a pulse of a second duration for zero). As illustrated, four digital input signals (112-1, 112-2, 112-3, and 112-4) are received in parallel. Each of these input signals receives a separate value of the input vector. In other embodiments, fewer or greater numbers of digital input signals may be received. Each of digital input signals 112 may be binary-encoded. Therefore, for each clock-cycle of the digital portion of the circuit, a bit for a particular bit-order is received as digital input signals 112. For example, if a four bit binary value is being input via each digital input signal, four clock cycles may be used for the binary values to be received and converted to the analog domain in parallel. The digital input signals 112 may be binary-encoded such that each value's bit-order may be received from the MSB to the LSB.

Digital input signals 112 may be input to one-bit DACs 114. The four one-bit DACs 114 (114-1, 114-2, 114-3, and 114-4) present are used only by way of example. In other embodiments, fewer or greater numbers of one-bit DACs 114 may be present. For example, other embodiments may use eight-bit, 16-bit, 32-bit, 64-bit, 128-bit, and/or the like representations of data. In this disclosure, four-bit data values may be used as a representative example for ease of explanation. However, the operations described below for the bits between the MSB and the LSB can be multiplied and repeated for any date of value width. Regardless of the number of bits, a single one-bit DAC may be present for each binary-encoded digital input signal 112. Each of the one-bit DACs 114 may output an analog signal indicative of the digital value received. Therefore, binary-encoded analog signals 116 (116-1, 116-2, 116-3, 116-4) can represent analog translations of the digital input signals 112.

In section 120, analog vector matrix multiplier 122 may receive binary-encoded analog signals 116. Analog vector matrix multiplier 122 may sequentially perform multiplication operations on each bit-order of the input values (e.g., a first clock cycle for the MSBs, a second clock cycle for the MSBs-1, a third clock cycle for the MSBs-2, etc.). Therefore, a separate multiplication operation may be performed for each bit-order of the received binary-encoded analog signals 116. Further detail regarding a possible embodiment of analog vector matrix multiplier 122 is provided above in relation to FIG. 2.

The successive binary-weighted ADC 504 in section 502 may receive the multiplication results signal 124 that is output from the analog vector matrix multiplier 122. For example, as each bit of the binary-encoded analog signals 116 (beginning with the MSB) are processed by the analog vector matrix multiplier 122, the results may be immediately passed to the successive binary-weighted ADC 504. The successive binary-weighted ADC 504 may then perform an analog-to-digital conversion on each analog bit received from the analog vector matrix multiplier 122. This may result in incrementally provided digital output signals 506 that are provided as each of the analog bits are processed by the analog vector matrix multiplier 122. Additionally, between each of the bits represented by the digital output signals 506, the successive binary-weighted ADC 504 may also provide carryover bits that may be used to construct the final digital representation of the result.

In some embodiments, section 502 of the circuit 500 may also include all or portions of section 130 from circuit 100 in FIG. 1. For example, some embodiments may include a charge integration circuit, a charge accumulation and redistribution circuit, and/or other portions of the summation componentry 132 used to generate a final analog result of the matrix multiplication process at this stage.

Figure 6:
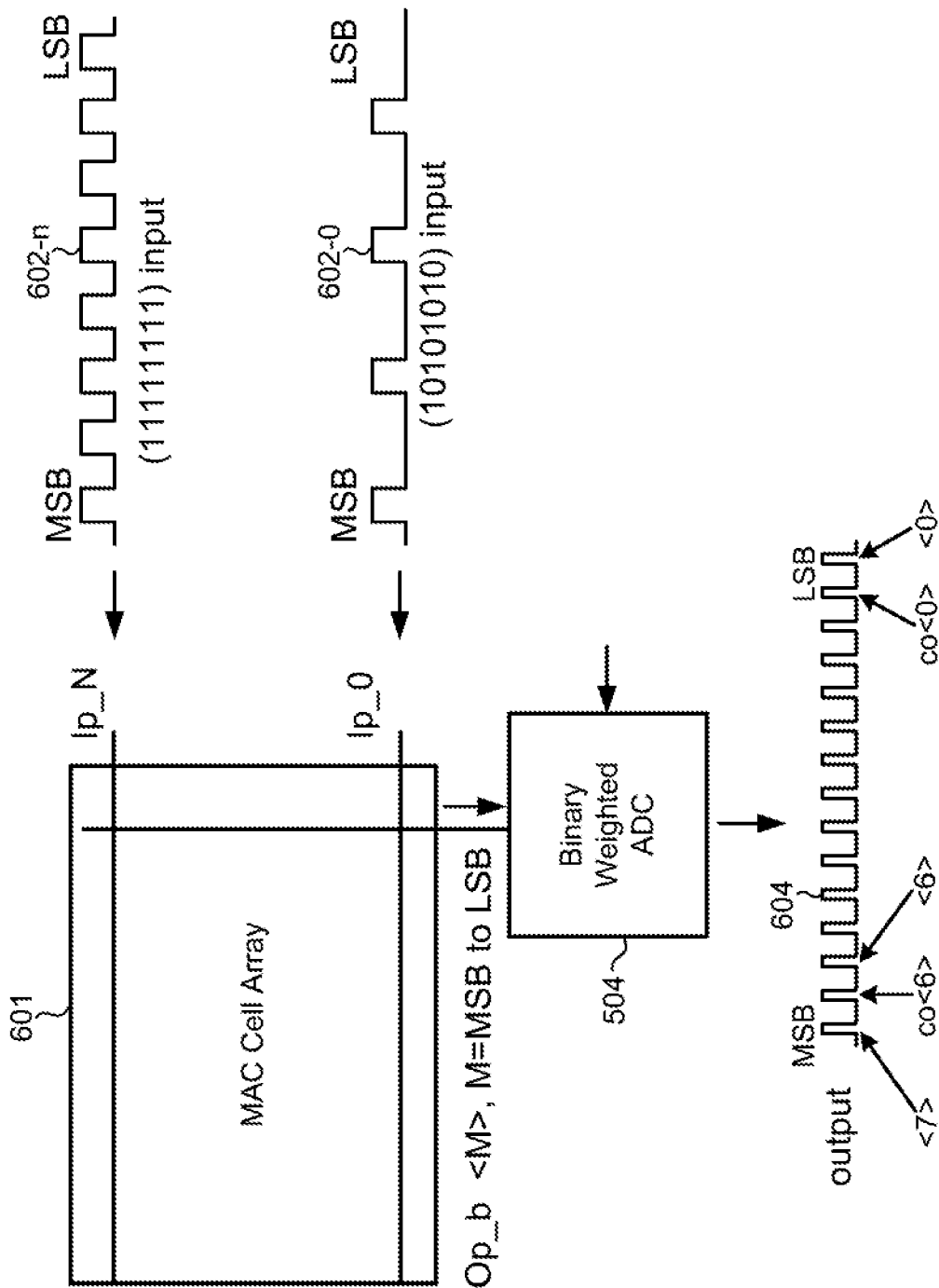
FIG. 6 illustrates how input streams of individual bits can be processed to produce a sequential output bit stream, according to some embodiments.

FIG. 6 illustrates how input streams of individual bits can be processed to produce a sequential output bit stream, according to some embodiments. The input vector $X_i$ in Equation 1 may be provided as a plurality of bit streams 602 (Ip_0 . . . Ip_N). For example, for 8-bit data representations, each of the values in the input vector may be represented using an 8-bit sequence. Each of the bit streams 602 may be ordered such that the MSB is provided first, and each lower-ordered bit is provided sequentially down to the LSB. In some embodiments, the bit streams 602 may be routed successively through 1-bit DACs as described above.

The analog values generated from each bit in the bit stream 602 may be provided one-at-a-time to a MAC cell array 601. The array 601 may be similar to the analog vector matrix multiplier 201 of FIG. 2 described above. The weight values in the array 601 may represent the matrix values for in Equation 2. As described above, the array 601 can receive the bits from a specific position in the bit streams 602 and process those bits together to generate an analog output that may be passed to the binary-weighted ADC 504. In some embodiments, the array 601 may also provide a value that indicates the bit position of the processed bit. For example, the first bit received by the array 601 may be the MSB of each of the bit streams 602. Each of the MSBs may be converted to an analog value and multiplied with the matrix values in the array 601. This may generate an analog current output from the array 601 that is provided to the binary-weighted ADC 504. This output may comprise a bit at index 7 of 8-bit data, or the MSB (e.g., Op_b<7>). This value may be described as an output that is used to control subsequent circuit elements later in the data path.

The binary-weighted ADC 504 may receive each bit as it is provided from the array 601. In contrast to the embodiment of FIG. 3, these embodiments may begin providing digital outputs 604 from the binary-weighted ADC 504 as soon as they are processed by the array 601. For example, instead of waiting for the total analog value on each of the capacitors in FIG. 3 to be provided from the array 601, and then performing an analog-to-digital conversion on the final analog value these embodiments may instead perform incremental analog-to-digital conversions on each analog value individually as they are provided from the array 601. As the MSB and a carry values from the MSB-1 of the bit streams 602 is processed by the array 601, the binary-weighted ADC 504 may generate the MSB of the digital outputs 604.

After processing each of the bits in the bit streams 602, the binary-weighted ADC 504 may provide the digital outputs indicative of the digital representation of the results of Equation 1. However, as illustrated in FIG. 6, the digital outputs 604 may include an additional N−1 bits for N-bit data. Specifically, between each of the bit values, the digital outputs 604 may also include a carryover bits representing carry values from the next bit in the bit stream to be added to a previous bit. For example, the digital outputs 608 may include a result for bit 7, a result for bit 6, a carryover result for bit 6 to be added to the result for bit 7, and so forth. This may result in a digital output 604 having 2N−1 bits for N-bit data.

Figure 7:
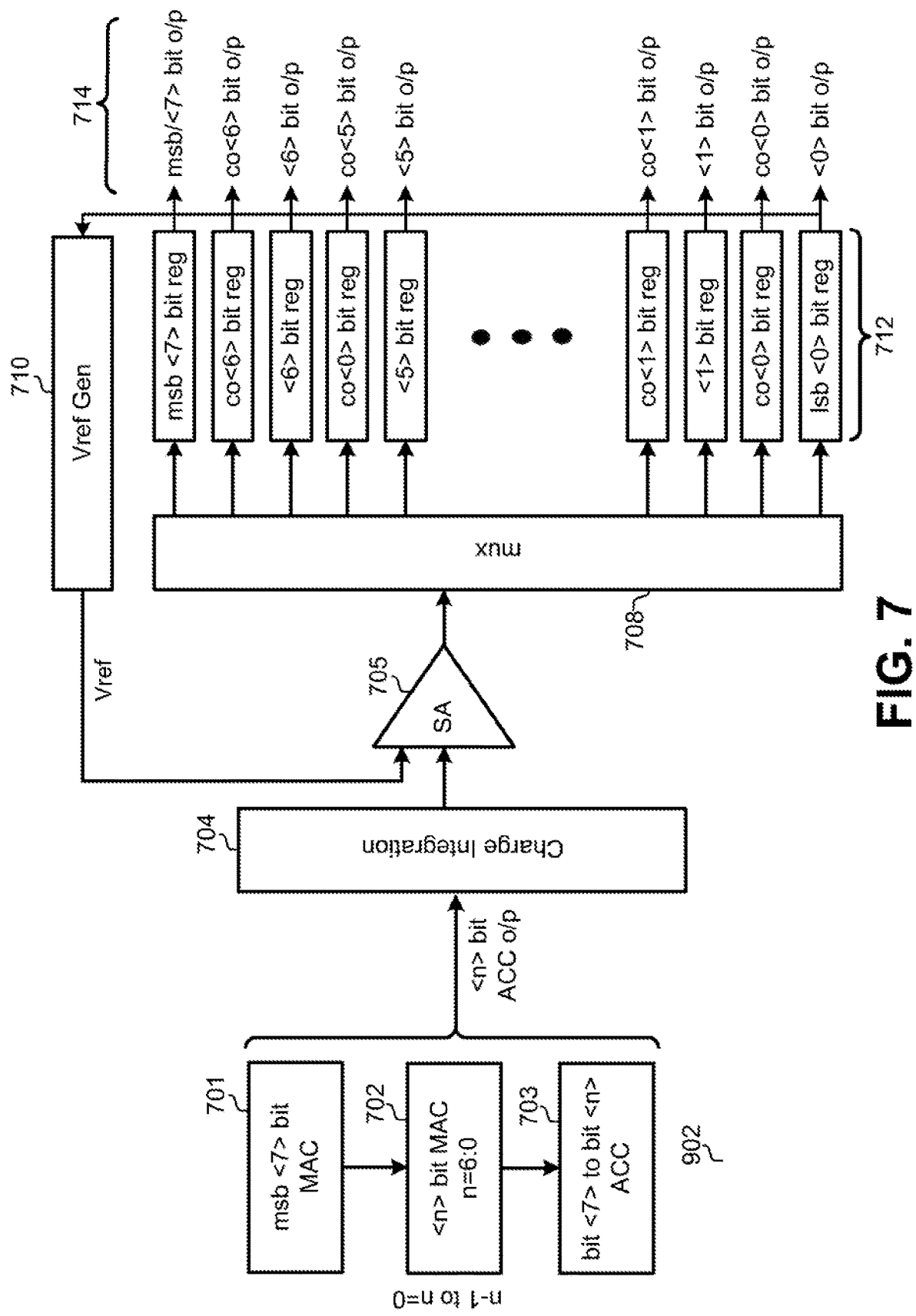
FIG. 7 illustrates a specific process for generating successive binary-weighted digital outputs, according to some embodiments.

FIG. 7 illustrates a specific process for generating successive binary-weighted digital outputs, according to some embodiments. This particular embodiment uses a charge integration circuit 704 in order to store the sequential outputs from the multiplication matrix. The following example again uses 8-bit data values as an example. However, the principles for processing bit 6 through bit 0 may be duplicated/removed to increase/decrease the number of bits used to represent each data value. The following description will walk through the process involved for each bit in the 8-bit value.

The MAC operations that are executed by the analog multiplication matrix are represented by the operation flow on the left-hand side of FIG. 7. Beginning with the MSB (e.g., bit 7) at operation 701, the MAC operation may output a current corresponding to the multiplication of the MSB from each of the input data values with the weights in the multiplication matrix. The current from the MAC operation may be passed to a charge integration circuit 704. The charge integration circuit 704 may include a capacitor that receives the current from the MAC operation and stores the analog value as charge on the capacitor. The charge integration circuit 704 may also include circuitry that scales the current as it is passed to the capacitor such that it corresponds to the bit-significance of the current operation. For example, when the MSB is received from the MAC operation, the charge integration circuit 704 may allow the full current (un-scaled) to be stored on the capacitor.

Next, a comparator 705 may receive the voltage on the capacitor as an input. The other input may be received from a voltage reference circuit 710. Initially, the output of the voltage reference circuit 710 may be set at a voltage level that is halfway between the full-scale output of the MAC operation. If the capacitor voltage is higher than the voltage reference, then the output of the comparator 704 will be a logic 1. If the capacitor voltage is lower than the voltage reference, then the output of the comparator 704 will be a logic 0.

As described above, the MAC operation may also provide a current bit value to the charge integration circuit 704 as an output. The current bit value may be used to scale the current to the appropriate level based on the current bit value. The current bit value may also be used as a select signal for a multiplexer 708 that routes the output of the comparator 705 to a particular register. For example, the multiplexer 708 may be coupled to a plurality of output registers 712. The current bit value may be used to select one of the output registers 712 corresponding to the current bit being processed. For the MSB, the "msb<7>bit reg" register may be selected, and the output of the comparator 705 may be latched in this register.

When a current value is latched in the corresponding registers 712, output signals 714 may be generated such that subsequent stages in a processing pipeline may begin using those bit outputs to process subsequent multiplication operations. At this stage, the "msb<7>bit o/p" (i.e., most-significant bit 7 output) output may be provided to a subsequent successive MAC operation similar to the multiplication operation described above in FIGS. 1-2. This output may represent the current binary significance for the current bit, and may be referred to as a digital bit value, or a "first digital bit value" related to the current bit being processed by the MAC operation.

At each stage, the value of the voltage reference 710 provided by the voltage reference circuit may be adjusted. Continuing with the example of the MSB (bit 7), if the output of the comparator 705 is a logic 1, a new increment DVref7=(½)Vref_msb may be provided for the voltage reference 710, where Vref_msb represents the original voltage reference used to process the MSB. On the other hand, if the output of the comparator 705 is a logic 0, the voltage reference may remain as Vref_msb without any additional increment. The reference voltage may incorporate at least two elements. One element may represent a base reference voltage, and its value may be determined by the bit-level significance. For charge integration embodiments, this may be represented below in Equation 5.

$$VrefNcb = \frac{1}{2^{M-(N+1)}} Vref\_msb. \quad \text{Eq. 5}$$

Bits of the same bit significance may have the same base reference voltage, e.g., bit<7> and co<6> may have the same base reference. The second element may include any accumulated additional adjustments that are applied if the comparator output is a logic 1. This accumulated adjustment can be formulated as shown in Appendix A for charge integration embodiments.

After processing the MSB (bit 7), the multiplication operation may output a result for the next-most-significant bit, or MSB-1 (bit 6). Following the same procedure described above, the analog value provided from the multiplication operation may be scaled by 0.5 to reflect the lower bit-order of the MSB-1 (bit 6), and the corresponding charge may be stored on the capacitor of the charge integration circuit 704. The resulting voltage on the capacitor may be provided to the comparator 705 along with the voltage reference 710. The signal provided by the voltage reference 710 may correspond to the voltage reference used for one bit higher than the current bit-level. In this example, the comparator may receive the Vref_msb signal level used by the MSB as described above.

The output of the comparator 705 in the previous cycle generated the digital value for the MSB. However, in the first cycle for the next MSB-1, the output of the comparator 705 may produce a carryover bit (e.g., co<6>) value. If the voltage on the capacitor of the charge integration circuit 704 is higher than the voltage reference 710, a logic 1 may be stored in the "co<6>bit reg" register. When the carryover bit is a logic 1, a new increment DVref6c=(½)Vref_msb may be provided for the voltage reference 710 such that it becomes (3/2)Vref_msb for the next comparator operation. Alternatively, if the voltage on the capacitor of the charge integration circuit 704 is lower than the voltage reference 710, a logic 0 may be stored in the "co<6>bit reg" register. This bit represents a carried bit that may be added to the MSB<7> as part of a standard arithmetic operation described below.

The analog output of the MSB-1 bit multiplication operation may be used for two different comparison operations, one to generate the MSB-1 carryover bit, or "second digital bit value" described above, and a subsequent comparator operation to generate the MSB-1 binary significance bit, or "first digital bit value" of the MSB-1 MAC operation. To generate the MSB-1 binary significance bit, the comparator may again compare the voltage on the capacitor to the reference level for MSB-1 level, which is Dvref6s+(½)Vref_msb, where DVref6s is sum of all accumulated DVrefvalues. For the MSB-1 bit, DVref6s=DVref7+DVref6c. If the capacitor voltage is higher, the bit output is 1, and if the capacitor voltage is lower, the bit output is 0. Finally, if the bit value is 1, the reference level may receive another increment of DVref6=(¼)Vref_msb.

In a general sense, each bit after the MSB may generate a carryover bit by using the voltage reference from the previous bit. For any bit after the MSB, the Nth carryover bit may be generated using the comparator as described above, which uses the reference signal from one bit higher in bit-significance level. If the higher significant output bit was a logic 1, then comparator reference level is raised by DVrefNc, where N is the Nth carryover bit and DVrefNc=1/$(2)^{M-(N+1)}$Vref_msb, where M is Mth=MSB bit, Vref_msb is MSB bit reference level, and N is the Nth bit which is operated from the Mth bit (MSB) to 0th bit (LSB). For each Nth carryover bit, the reference level is VrefNc=VrefNcb+DvrefNcs, where VrefNcb=1/$(2)^{M-(N+1)}$ Vref_msb is Nth carrier-over bit base reference level (i.e., the (N+1)th bit base reference level), and DvrefNcs=$\Sigma_{K=M}^{N+1}$DVrefNc+DVrefN is the accumulated sum of raised Vref increments prior to the Nth bit.

Similarly, the Nth bit comparator operation for the current bit significance current binary uses the reference level. The current binary output bit is one if the integrated charge level is higher than the reference level, and the comparator reference level is raised up by DVrefN=1/$(2)^{M-N+1}$ Vref_msb. For each Nth bit, the reference level is VrefN=VrefNb+DvrefNs, where VrefNb=1/$(2)^{M-N}$*Vref_msb is Nth bit base reference level, and DVrefNs=$\Sigma_{K=M}^{N}$DVrefNc+$\Sigma_{K=M}^{N+1}$DVrefN is the accumulated sum of raised Vref increments prior Nth carryover bit. This general process may be repeated for each bit in the sequence down to the LSB. As described below, each binary output has a carryover bit and a regular bit for the current bit-level significance. These two bits may feed a subsequent layer of a MAC operation directly. By way of example, the Appendix A completes the operation illustrated in FIG. 7 for charge integration embodiments using 8-bit data.

Figure 8:
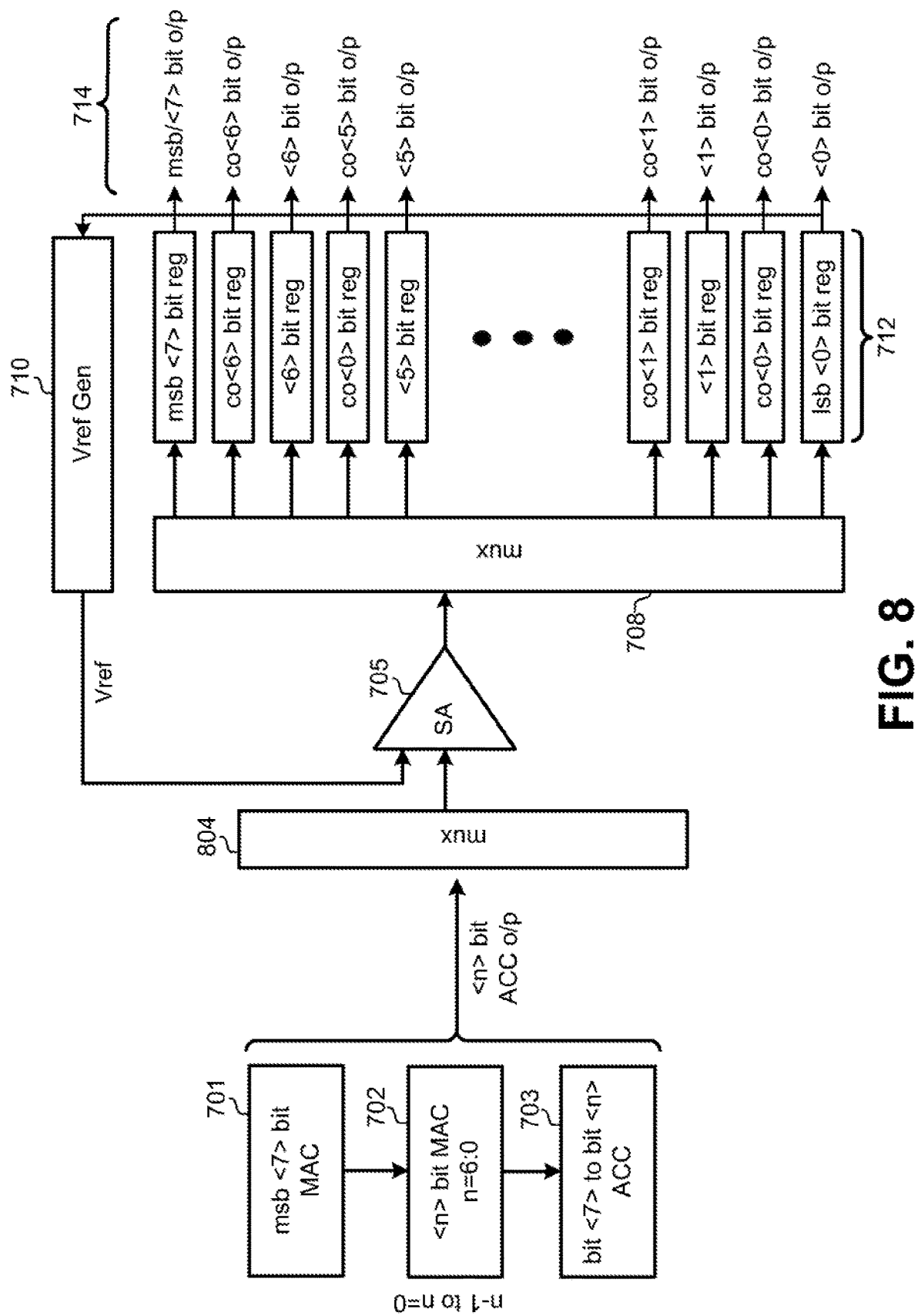
FIG. 8 illustrates a specific process for generating successive binary-weighted digital outputs, according to some embodiments.

FIG. 8 illustrates a specific process for generating successive binary-weighted digital outputs, according to some embodiments. This circuit is similar to the circuit illustrated in FIG. 7 above. However, instead of using a charge integration circuit 704, this circuit uses a multiplexer to receive different outputs from the multiplication function. Instead of scaling the analog outputs from the multiplication function and adding charge associated to these outputs to a single integration capacitor, this circuit can select different outputs from the multiplication function and provide them to the comparator. The function operates as described above in relation to FIG. 7, except that the voltage reference 710 may be scaled accordingly.

Figure 9:
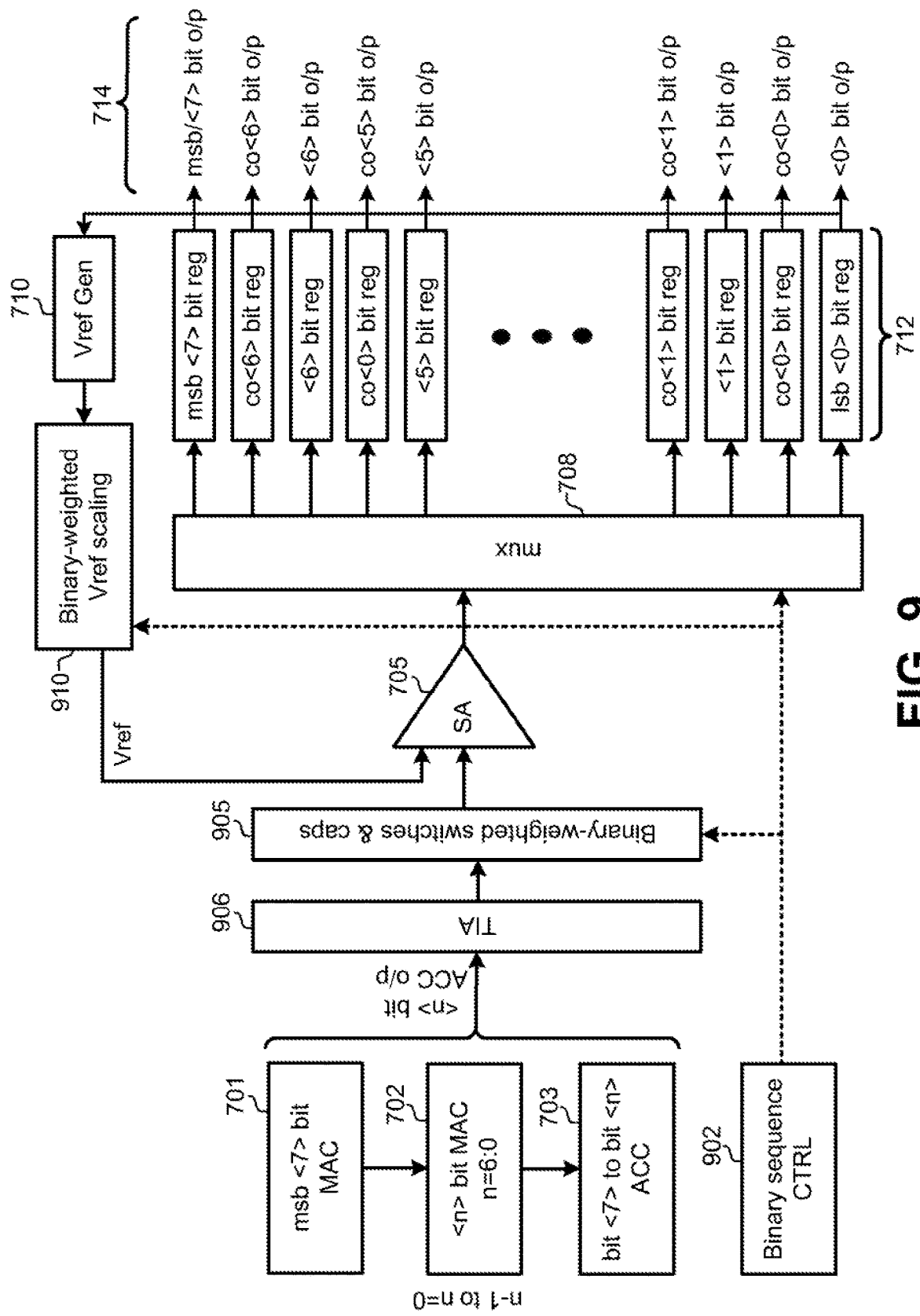
FIG. 9 illustrates an alternative process for generating successive binary-weighted digital outputs, according to some embodiments.

FIG. 9 illustrates an alternative process for generating successive binary-weighted digital outputs, according to some embodiments. Specifically, the circuit may include a transimpedance (TIA) or sense amplifier 906 along with a plurality of binary-weighted switches and/or capacitors 905. This may be similar to the arrangement illustrated above in FIG. 3. The analog outputs from the multiplication function may each be stored on a dedicated capacitor separated by a plurality of switches. A binary sequence control 902 may be provided to the binary-weighted switches and/or capacitors 905 to control the switches such that the analog output of the multiplication function is stored on the correct capacitor.

As described above, the MSB may be processed once by the comparator 705, and each of the successive bits following the MSB may be processed twice by the comparator 705. The MSB may generate a first digital bit value (e.g., "msb<7>bit reg"), and each of the following bits may generate both a first digital bit value and a second digital bit value (e.g., the carryover bits). At each stage, the voltage reference 710 may be scaled based on the binary weight of the corresponding bit. Therefore, a binary-weighted reference scaling circuit 910 may be included on the output of the voltage reference 710. The voltage reference 710 may be scaled using voltage dividers, capacitive dividers, and/or any other method of selectively scaling a voltage.

The following description details the operations for processing the MSB and each of the bits following the MSB for 8-bit data. First, the MSB bit <7> MAC current may be converted with the TIA 906 to a voltage, and the associated MSB capacitor 905 may be charged up to the voltage. The comparator 705 may compare this voltage with the MSB reference level, which may be Vref_msb7=Vref_msb. The MSB output bit may be 1 if the voltage is higher than the Vref_msb7, and the reference level may be raised by DVref7=(½)Vref_msb7.

Proceeding to the operations for the MSB-1 bit (e.g., bit 6), the output current of the multiplication operation may be converted by the TIA 906 to a voltage and stored on the associated capacitor 905. This capacitor may be half the size of the MSB capacitor described above. Next, the MSB-1 capacitor may be connected through the switches to the MSB capacitor to redistribute the charge. The voltage reference 710 may be adjusted to compensate for the added capacitance effect with a ratio of RVC6=1/(1+½)=⅔. The co<6> reference level may be Vref6c=(Vref_msb+DVref6cs)*RVC6=⅔*Vref_msb, where DVref6cs=DVref7. The comparator may then compare the redistributed voltage on the capacitors to (⅔)Vref_msb. After the comparison, the co<6> may be set to logic 1 if the redistributed voltage level is higher than the reference value, or co<6> may be set to logic 0 otherwise. If co<6>=1, then the reference voltage level is raised by DVref6c=(½)Vref_msb with the capacitance ratio to be applied properly.

Next, the second half of the operation on the MSB-1 bit may be performed. The first half of the operation described above may generate the carryover bit, while the second half may generate the bit-level significance bit for the MSB-1 multiplication operation. The comparator 705 may receive the bit<6> reference level, which is Vref6=RVC6((½)Vref_msb+DVref6s), where DVref6s=DVref7+DVref6c. The bit<6> output may be logic 1 if the bit level is higher than the reference, or the bit<6> output may be logic 0 otherwise. By way of example, Appendix B completes the operation illustrated in FIG. 9 for TIA embodiments using 8-bit data.

Figure 10:
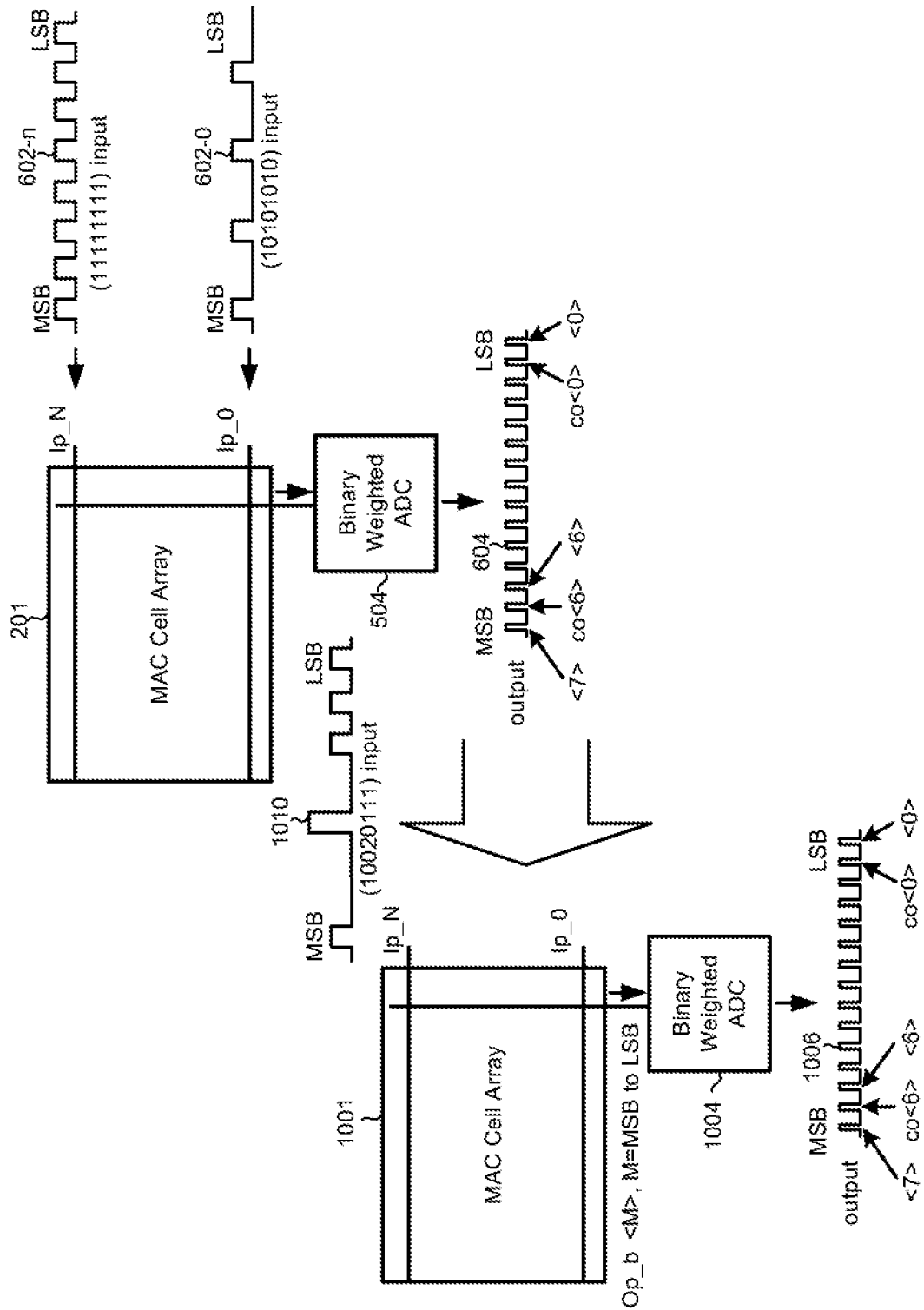
FIG. 10 illustrates a pipeline of successive MAC operations that may be layered and executed successively as bits are individually processed between each layer, according to some embodiments.

FIG. 10 illustrates a pipeline of successive MAC operations that may be layered and executed successively as bits are individually processed between each layer, according to some embodiments. The pipeline may include a first stage that includes the MAC cell array 601 and the binary-weighted ADC 504 illustrated above in FIG. 6. The output of the first stage of the pipeline may include a stream of successively generated bits 604 as described above. The stream of successively generated bits 604 may include bit-level significance bits referred to as "first digital bit values" and illustrated in FIG. 10 as <7>, <6>, . . . <0> in the example of 8-bit data. The stream of successively generated bits 604 may also include carryover bits referred to as "second digital bit values" and illustrated in FIG. 10 as co<6>, . . . co<0>. As each bit in the stream of successively generated bits 604 is output from the binary-weighted ADC 504, these bits may be made available as an input to a successive stage.

The pipeline may also include a second stage that includes a second MAC cell array 1001 and a second binary-weighted ADC 1004. The second MAC cell array 1001 may receive the stream of successively generated bits 604 from the output of the first binary-weighted ADC 504 in the first stage of the pipeline. In some embodiments, the entire bit stream may be provided directly to the MAC cell array 1001 such that it includes both the first digital bit values and the second digital bit values (e.g., the bit-level significance bits and the carryover bits) in the bit stream. In other embodiments, the carryover bits may be combined with the bit-level significance bits such that the input bit stream to the second MAC cell array 1001 is the same width as the rest of the data path (e.g., 8 bits). These bits may be combined by adding the carryover bits to the preceding bit-level significance bit. This may result in some bit values having a value of "2" represented by double the voltage/current as a logic 1 signal on the input.

FIG. 10 illustrates one of the advantages provided by a successive binary-weighted ADC on the output of a MAC operation. Specifically, instead of waiting for all of the bits to be processed by a first MAC stage in the pipeline, the second MAC stage in the pipeline can begin processing bits as they are output. Recall from the discussion above that both of the MAC cell arrays 201, 1001 successively received bits at the input using a plurality of 1-bit DACs. Therefore, as single bits provided by a first stage, the second stage can begin performing the 1-bit DAC operation. After a 2-cycle delay, the <7> and co<6> bits may be provided at the output of the first binary-weighted ADC 504. These bits may then be received immediately by the second MAC cell array 1001 without waiting for the <6> bit and any subsequent bits to be provided by the first stage of the pipeline.

Although FIG. 10 illustrates only two stages of a MAC pipeline, other embodiments may include many additional stages as well that are not explicitly depicted in FIG. 10. Prior to this disclosure, each additional stage would require at least N additional clock cycles, where N represents the number of bits in the data path. However, using the embodiments described herein and depicted in FIG. 10, each additional stage requires only an additional 2 clock cycles as a delay to prepare the first two bits that are output from each stage.

Figure 11:
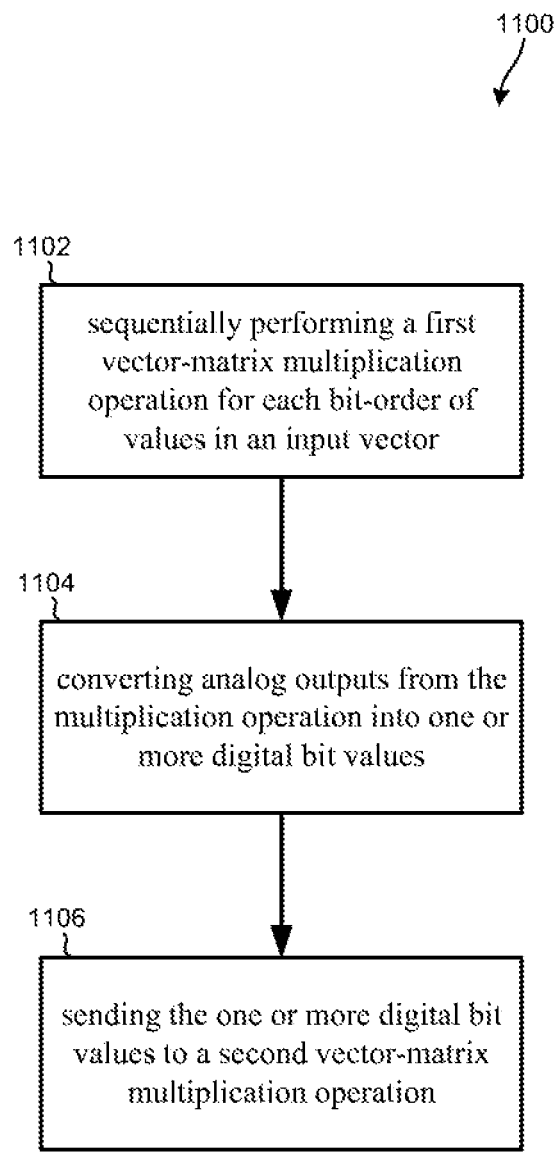
FIG. 11 illustrates a flowchart of a method for performing successive binary-weighted digital-to-analog conversions, according to some embodiments.

FIG. 11 illustrates a flowchart of a method 1100 for performing successive binary-weighted digital-to-analog conversions, according to some embodiments. Each of the steps in the method 1100 may be carried out as described above in FIGS. 1-10. Specifically, any of the operations, features, and/or circuits described above may be used to carry out these operations.

The method may include sequentially performing a first vector-matrix multiplication operation for each bit-order of values in an input vector (1102). The first vector-matrix multiplication operation for each bit-order may generate an analog output. For example, a MAC cell array may be used as described above to receive each successive digital bit from values in an input vector. These values may be successively converted into analog signals by 1-bit DACs and may be processed by an analog multiplication matrix. The analog output may include an analog current representing the results of the multiply/accumulate operation represented by the matrix.

The method may also include converting the analog outputs from the MAC operation into one or more digital bit values (1104). This conversion may be executed by providing a voltage reference as one input to a comparator. As the other input to the comparator, some embodiments may provide a voltage that is based on the analog output from the vector-matrix multiplication operation. For example, a transimpedance amplifier may convert the analog current to a voltage, which may be stored on an integration capacitor, or on individual capacitors representing each bit-level significance. In some embodiments, each analog output representing a single multiplication operation output may be converted into one or more digital bit values. For example, a MSB may be converted into a single bit-level significance bit, which may be referred to as a first digital bit value. For bits following the MSB down to the LSB, each bit may be converted into both a bit-level significance bit and a carry-over bit, referred to as a second digital bit value. The terms "first" and "second" do not imply order or importance, but merely distinguish these two bits from each other in the operation. Depending on the particular embodiment, different methods may be used to adjust the reference signal provided to the comparator when the first digital bit value represents a logic 1. Conversely, the reference signal may remain the same as the base reference voltage at the current bit-level significance when the output of the comparator is a logic 0 (i.e., no additional adjustment of the base reference voltage is needed at the current bit-level, even though base reference voltage for each successive bit level may be different). These different methods of adjusting the reference signal are described in detail above and in Appendix A and Appendix B.

The method may further include sending the one or more digital bit values to a second vector-matrix multiplication operation (1106). This operation may be optional in some embodiments, and it may be included for architectures in which a pipeline includes a plurality of MAC stages where the output of one MAC stage feeds the input of a subsequent MAC stage. A 2-cycle delay may be present between each MAC stage to generate the MSB bit and the first carryover bit from a previous stage.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

APPENDIX A

Operation Mechanism with Charge Integration
1. Charge is integrated from MSB to LSB input bits with binary weighted method
2. Binary weighted by scaling MAC current for charging up capacitor
3. After charge integration/charged for each binary bit, two comparator checks in sequence are performed.
    1. Nth Carrier-Over bit comparator checks with one bit higher significant reference level. The higher significant output bit is one if the integrated charge level is higher, and the comparator reference level is raised by DVrefNc, which N is the Nth carrier-over bit. This higher significant output bit is borrower bit. $DVrefNc=1/(2)^{M-N}$ Vref_msb, where M is Mth=MSB bit and Vref_msb is MSB bit reference level. N is the Nth bit which is operated from Mth (MSB) to $0^{th}$ (LSB).
    2. Nth (Current) bit comparator checks current binary reference level. The current binary output bit is one if the integrated charge level is higher, and the comparator reference level is raised up by $DVrefN=1/(2)^{M-N+1}*Vref\_msb$
4. For each Nth carrier-over bit the reference level is VrefNc=VrefNcb+DvrefNcs, VrefNcb is Nth carrier-over bit Base reference level which is (N+1)th bit Base reference level. $VrefNcb=1/(2)^{M-(N+1)}*Vref\_msb$. DvrefNcs is the accumulated sum of raised Vref prior Nth bit. $DvrefNcs=\Sigma_{K=M}^{N+1}VrefNc+DVrefN$
5. For each Nth bit the reference level is VrefN=VrefNb+DvrefNs, VrefNb is Nth bit Base reference level. $VrefNb=1/(2)^{M-N}*Vref\_msb$. DVrefNs is the accumulated sum of raised Vref prior Nth carrier-over bit. $DVrefNs=\Sigma_{K=M}^{N}DVrefNc+\Sigma_{K=M}^{N+1}DVrefN$ 6. Continue down to LSB bit.
7. The reference level adjustments can be obtained from DAC circuits.
8. Each binary output has borrower bit and own bit. The two bits feed next layer of MAC operation directly.
9. At input drivers, e.g., DL driver the binary bits are checked for each current bit and carrier-over bits from next significant bit.
    1. If one of current or carrier-over bits is 1, the input strength, e.g., voltage level is 1.
    2. If both current or carrier-over bits are 1, the input strength, e.g., voltage level is doubled.
    3. This can reduce the charge integration time to half
    4. Triple level DL driver/DAC is needed for this operation.

Example Operation Mechanism with Charge Integration using 8-bit MAC

1. MSB bit MAC current charges up integration capacitor.
    1. Comparator checks capacitor voltage to MSB reference level (Vref_msb).
        1. If capacitor voltage is higher MSB <7> bit output is 1, or it is 0.
        2. If <7>=1, the reference level is raised by Dvref7=½*Vref_msb.
2. Bit<6> bit MAC current charges up integration capacitor with current ratio at 0.5 (compared to MSB MAC).
    1. Comparator checks capacitor voltage to MSB reference level Vref_msb.
        1. If capacitor voltage is higher, co<6>bit output is 1, or co<6>=0. Here, co<6> is carrier-over bit <7>.
        2. If co<6>=1, the reference level is raised by DVref6c=½*Vref_msb to ¾*Vref_msb.
    2. Comparator checks capacitor voltage to <6> reference level which is Dvref6s+½*Vref_msb. DVref6s is sum of all accumulated DVref's. DVref6s=DVref7+DVref7c.
        1. If capacitor voltage is higher, <6> bit output is 1, or <6>=0.
        2. If <6>=1, the reference level is raised by DVref6=¼*Vref_msb.
3. Bit<5> bit MAC current charges up integration capacitor with current ratio at 0.25 (compared to MSB MAC).
    1. Comparator checks capacitor voltage to <6> bit reference level which is Dvref5cs+½*Vref_msb. Dvref5cs=DVref7+DVref6c+DVref6.
        1. If capacitor voltage is higher, co<5> bit output is 1, or co<5>=0.
        2. If co<5>=1, the reference level is raised by DVref5c=¼*Vref_msb.
    2. Comparator checks capacitor voltage to <5> reference level which is Dvref5s+¼*Vref_msb. Dvref5s=DVref7+DVref6c+DVref6+DVref5c.
        1. If capacitor voltage is higher, <5> bit output is 1, or <5>=0.
        2. If <5>=1, the reference level is raised to ⅛*Vref_msb
4. Bit<4> bit MAC current charges up integration capacitor with current ratio at ⅛ (compared to MSB MAC).
    1. Comparator checks capacitor voltage to <5> reference level which is Dvref4cs+¼*Vref_msb. Dvref4cs=DVref7+DVref6c+DVref6+DVref5c+DVref5.
        1. If capacitor voltage is higher, MSB co<4> bit output is 1, or co<4>=0.
        2. If co<4>=1, the reference level is raised by DVref4c=⅛*Vref_msb.
    2. Comparator checks capacitor voltage to <4> reference level which is Dvref4s+⅛*Vref_msb. Dvref4s=DVref7+DVref6c+DVref6+DVref5c+DVref5+DVref4c.
        1. If capacitor voltage is higher, <4> bit output is 1, or <4>=0.
        2. If <4>=1, the reference level is raised by DVref4=1/16*Vref_msb
5. Bit<3> bit MAC current charges up integration capacitor with current ratio at 1/16 (compared to MSB MAC).
    1. Comparator checks capacitor voltage to <4> bit reference level which is Dvref3cs+⅛*Vref_msb. Dvref3cs=DVref7+DVref6c+DVref6+DVref5c+DVref5+DVref4c+Dvref4.
        1. If capacitor voltage is higher, co<3> bit output is 1, or co<3>=0.
        2. If co<3>=1, the reference level is raised by DVref3c=1/16*Vref_msb.
    2. Comparator checks capacitor voltage to <3> reference level which is Dvref3s+1/16*Vref_msb. Dvref3s=DVref7+DVref6c+DVref6+DVref5c+DVref5+DVref4c+Dvref4+DVref 3c.
        1. If capacitor voltage is higher, <3> bit output is 1, or <3>=0.
        2. If <3>=1, the reference level is raised by DVref3=1/32*Vref_msb.
6. Bit<2> bit MAC current charges up integration capacitor with current ratio at 1/32 (compared to MSB MAC).
    1. Comparator checks capacitor voltage to <3> bit reference level which is Dvref2cs+1/16*Vref_msb. Dvref2cs=DVref7+DVref6c+DVref6+DVref5c+DVref5+DVref4c+Dvref4+DVre f3c+DVref3.
        1. If capacitor voltage is higher, co<2> bit output is 1, or co<2>=0.
        2. If co<2>=1, the reference level is raised by DVref2c=1/32*Vref_msb.
    2. Comparator checks capacitor voltage to <2> reference level which is Dvrefs+1/32*Vref_msb. Dvref2s=DVref7+DVref6c+DVref6+DVref5c+DVref5+DVref4c+Dvref4+DVref 3c+DVref3+DVref2c.
        1. If capacitor voltage is higher, <2> bit output is 1, or <2>=0.
        2. If <2>=1, the reference level is raised by DVref2=1/64*Vref_msb.
7. Bit<1> bit MAC current charges up integration capacitor with current ratio at 1/64 (compared to MSB MAC).
    1. Comparator checks capacitor voltage to <2> bit reference level which is Dvref1cs+1/32*Vref_msb. Dvref1cs=DVref7+DVref6c+DVref6+DVref5c+DVref5+DVref4c+Dvref4+DVre f3c+DVref3+DVref2c+DVref2.
        1. If capacitor voltage is higher, co<1> bit output is 1, or co<1>=0.
        2. If co<1>=1, the reference level is raised by DVref1c=1/64*Vref_msb.
    2. Comparator checks capacitor voltage to <1> reference level which is Dvrefs+1/64*Vref_msb. Dvref1s=DVref7+DVref6c+DVref6+DVref5c+DVref5+DVref4c+Dvref4+DVref 3 c+DVref3+DVref2c+DVref2+DVref1c.
        1. If capacitor voltage is higher, <1> bit output is 1, or <1>=0.
        2. If <1>=1, the reference level is raised by DVref1=1/128*Vref_msb.
8. Bit<0> bit MAC current charges up integration capacitor with current ratio at 1/128 (compared to MSB MAC).

1. Comparator checks capacitor voltage to <1> bit reference level which is Dvrefs+1/64*Vref_msb. Dvref0cs=DVref7+DVref6c+DVref6+DVref5c+ DVref5+DVref4c+Dvref4+DVref3c+DVref3+ DVref2c+DVref2+DVref1c+DVref1.
    1. If capacitor voltage is higher, co<0> bit output is 1, or co<0>=0.
    2. If co<0>=1, the reference level is raised by DVref0c=1/128*Vref_msb.
2. Comparator checks capacitor voltage to <0> reference level which is Dvrefs+1/64*Vref_msb. Dvref1s=DVref7+DVref6c+DVref6+DVref5c+ DVref5+DVref4c+Dvref4+DVref3c+DVref3+ DVref2c+DVref2+DVref1c+DVref1+DVref0c. If capacitor voltage is higher, <0> bit output is 1, or <0>=0.

APPENDIX B

Operation Mechanism with a Transimpedance Amplifier, Capacitors, and Switches
1. MAC from MSB to LSB input bits with binary weighted method
2. TIA converts the MAC current for each binary bit into voltage and voltage is held in binary weighted capacitors
    1. From MSB to LSB each binary bit has its binary weighted capacitor to store TIA output voltage.
    2. As the TIA output voltage is stored, the storing capacitor is connected to other capacitors associated to higher significant bits. This will adding new binary charge (represented in voltage and capacitance) and redistribute the total charge.
    3. The reference level needs adjustment for added capacitance. The ratio of adjusted reference level is $RVCN=\Sigma_{K=M}^{N+1} 1/(2)^{M-N}$. The ratio will be applied to each binary step after charge is redistributed.
3. After charge redistribution of each binary bit, two comparator checks in sequence are performed.
    1. Carrier-over bit comparator checks with one bit higher significant reference level. The carrier-over bit is one if the redistributed capacitor level is higher, and the comparator reference level is raised by $DVrefNc=1/(2)^{M-N}*Vref\_msb$, where M is Mth=MSB bit and Vref_msb is MSB bit reference level. N is the Nth bit which is operated from Mth (MSB) to $0^{th}$ (LSB).
    2. Nth (Current) bit comparator checks current binary reference level. The current binary output bit is one if the integrated charge level is higher, and the comparator reference level is raised up by $DVrefN=1/(2)^{M-N+1}*Vref\_msb$
4. For each Nth carrier-over bit the reference level is VrefNc=(VrefNcb+DvrefNcs)*RVCN, VrefNcb is Nth carrier-over bit Base reference level which is (N+1)th bit Base reference level. $VrefNcb=1/(2)^{M-(N+1)}$ *Vref_msb. DvrefNcs is the accumulated sum of raised Vref prior Nth bit. $DvrefNcs=\Sigma_{K=M}^{N+1} VrefKc+DVrefK$
5. For each Nth bit the reference level is VrefN=(VrefNb+ DvrefNs)*RVCN, VrefNb is Nth bit Base reference level. $VrefNb=1/(2)^{M-N}*Vref\_msb$. DVrefNs is the accumulated sum of raised Vref prior Nth carrier-over bit. $DVrefNs=\Sigma_{K=M}^{N} DVrefKc+\Sigma_{K=M}^{N+1} DVrefK$
6. Continue down to LSB bit.
7. Each binary output has borrower bit and own bit. The two bits feed next layer of MAC operation directly.

Example Operation Mechanism with a TIA using 8-bit Data
1. MSB bit <7> MAC current is converted with TIA to be V<7> and associated MSB capacitor is charged up to V<7>.
    1. Comparator is checking this V<7> with MSB reference level, Vref_msb7=Vref_msb.
        1. MSB output bit is 1 if V<7> is higher than the Vref_msb7.
        2. If <7>=1, the reference level is raised by DVref7=1/2*Vref_msb7.
2. bit <6> MAC current is converted with TIA to be V<6> and associated bit<6> capacitor (half size of MSB capacitor) is charged up to V<6>.
    1. <6> capacitor is connected to <7> capacitor to redistribute charge.
    2. Reference level is adjusted for added capacitance effect with ratio RVC6=1/(1+1/2)=2/3.
    3. The co<6> reference level is Vref6c=(Vref_msb+ DVref6cs)*RVC6=2/3* Vref_msb. Where, DVref6cs=DVref7.
        1. comparator checks redistributed level to 2/3*Vref_msb.
        2. co<6>=1 if redistributed level is higher, or co<6>=0.
        3. If co<6>=1, The reference level is raised by DVref6c=1/2*Vref_msb with capacitance ratio to be applied properly.
    4. Comparator checks with bit<6> reference level Vref6=RVC6*(1/2*Vref_msb+DVref6s). Where, DVref6s=DVref7+DVref6c.
        1. Bit<6> output is 1 if the level is higher, or the bit<6> output is 0.
        2. If <6>=1, The reference level is raised by DVref6=1/4*Vref_msb with capacitance ratio to be applied properly.
3. bit <5> MAC current is converted with TIA to be V<5> and associated bit<5> capacitor (quarter size of MSB capacitor) is charged up to V<5>.
    1. <5> capacitor is connected to <7> and <6> capacitors to redistribute charge.
    2. Reference level is adjusted for added capacitance with ratio RVC5=1/(1+1/2+1/4)=4/7.
    3. The co<5> reference level is Vref5c=(1/2*Vref_msb+ DVref5cs)*RVC5=4/7*(1/2*Vref_msb+Dvref5s). Where, DVref5cs=DVref7+DVref6c+DVref6.
        1. comparator checks redistributed level to Vref5c.
        2. co<5>=1 if redistributed level is higher, or co<5>=0.
        3. If co<5>=1, The reference level is raised by DVref5c=1/4*Vref_msb with capacitance ratio to be applied properly.
    4. Comparator checks with bit<5> reference level Vref5=RVC5*(1/4*Vref_msb+DVref5). DVref5=DVref7+DVref6c+DVref6+DVref5c.
        1. Bit<5> output is 1 if the level is higher, or the bit<5> output is 0.
        2. If <5>=1, The reference level is raised by DVref5=1/8*Vref_msb with capacitance ratio to be applied properly.
4. bit <4> MAC current is converted with TIA to be V<4> and associated bit<4> capacitor (one eighth size of MSB capacitor) is charged up to V<4>.
    1. <4> capacitor is connected to <7>, <6>, <5> capacitors to redistribute charge.
    2. Reference level is adjusted for added capacitance with ratio RVC4=1/(1+1/2+1/4+1/8)=8/15

3. The co<4> reference level is Vref4c=(¼*Vref_msb+DVref4cs)*RVC4=⁸⁄₁₅*(¼*Vref_msb+Dvref4cs). Where, DVref4cs=DVref7+DVref6c+DVref6+DVref5c+DVref5.
   1. comparator checks redistributed level to Vref4c.
   2. co<4>=1 if redistributed level is higher, or co<4>=0.
   3. If co<4>=1, The reference level is raised by DVref4c=⅛*Vref_msb with capacitance ratio to be applied properly.
4. Comparator checks with bit<4> reference level Vref4=RVC4*(⅛*Vref_msb+DVref4). DVref4=DVref7+DVref6c+DVref6+DVref5c+DVref5+DVref4c.
   1. Bit<4> output is 1 if the level is higher, or the bit<4> output is 0.
   2. If <4>=1, The reference level is raised by DVref4=¹⁄₁₆*Vref_msb with capacitance ratio to be applied properly.
5. bit <3> MAC current is converted with TIA to be V<3> and associated bit<3> capacitor (one sixteenth size of MSB capacitor) is charged up to V<3>.
   1. <3> capacitor is connected to <7>, <6>, <5>, <4> capacitors to redistribute charge.
   2. Reference level is adjusted for added capacitance with ratio RVC3=1/(1+½+¼+⅛+¹⁄₁₆)=¹⁶⁄₃₁
   3. The co<3> reference level is Vref3c=(⅛*Vref_msb+DVref3cs)*RVC3=¹⁶⁄₃₁*(⅛*Vref_msb+Dvref3cs). Where, DVref3cs=DVref7+DVref6c+DVref6+DVref5c+DVref5+DVref4c+DVref4.
      1. comparator checks redistributed level to Vref3c.
      2. co<3>=1 if redistributed level is higher, or co<3>=0.
      3. If co<3>=1, The reference level is raised by DVref3c=¹⁄₁₆*Vref_msb with capacitance ratio to be applied properly.
   4. Comparator checks with bit<3> reference level Vref3=RVC3*(¹⁄₁₆*Vref_msb+DVref3). DVref3=DVref7+DVref6c+DVref6+DVref5c+DVref5+DVref4c+DVref4+DVref 3c.
      1. Bit<3> output is 1 if the level is higher, or the bit<3> output is 0.
      2. If <3>=1, The reference level is raised by DVref3=¹⁄₃₂*Vref_msb with capacitance ratio to be applied properly.
6. bit <2> MAC current is converted with TIA to be V<2> and associated bit<2> capacitor (¹⁄₃₂ size of MSB capacitor) is charged up to V<2>.
   1. <2> capacitor is connected to <7>, <6>, <5>, <4>, <3> capacitors to redistribute charge.
   2. Reference level is adjusted for added capacitance with ratio RVC2=1/(1+½+¼+⅛+¹⁄₁₆+¹⁄₃₂)=³²⁄₆₃
   3. The co<2> reference level is Vref2c=(¹⁄₁₆*Vref_msb+DVref2cs)*RVC2=³²⁄₆₃*(¹⁄₁₆*Vref_msb+Dvref2cs). Where, DVref2cs=DVref7+DVref6c+DVref6+DVref5c+DVref5+DVref4c+DVref4+DVr ef3c+DVref3.
      1. comparator checks redistributed level to Vref2c.
      2. co<2>=1 if redistributed level is higher, or co<2>=0.
      3. If co<2>=1, The reference level is raised by DVref2c=¹⁄₃₂*Vref_msb with capacitance ratio to be applied properly.
   4. Comparator checks with bit<2> reference level Vref2=RVC2*(¹⁄₃₂*Vref_msb+DVref2). DVref2=DVref7+DVref6c+DVref6+DVref5c+DVref5+DVref4c+DVref4+DVref 3c+DVref3+DVref2c.
      1. Bit<2> output is 1 if the level is higher, or the bit<2> output is 0.
      2. If <2>=1, The reference level is raised by DVref2=¹⁄₆₄*Vref_msb with capacitance ratio to be applied properly.
7. bit <1> MAC current is converted with TIA to be V<1> and associated bit<1> capacitor (¹⁄₆₄ size of MSB capacitor) is charged up to V<1>.
   1. <1> capacitor is connected to <7>, <6>, <5>, <4>, <3>, <2> capacitors to redistribute charge.
   2. Reference level is adjusted for added capacitance with ratio RVC2=1/(1+½+¼+⅛+¹⁄₁₆+¹⁄₃₂+¹⁄₆₄)=⁶⁴⁄₁₂₇
   3. The co<1> reference level is Vref1c=(¹⁄₃₂*Vref_msb+DVref1cs)*RVC1=⁶⁴⁄₁₂₇*(¹⁄₃₂*Vref_msb+Dvref1cs). Where, DVref1cs=DVref7+DVref6c+DVref6+DVref5c+DVref5+DVref4c+DVref4+DVr ef3c+DVref3+DVref2c+DVref2.
      1. comparator checks redistributed level to Vref1c.
      2. co<1>=1 if redistributed level is higher, or co<1>=0.
      3. If co<1>=1, The reference level is raised by DVref1=¹⁄₆₄*Vref_msb with capacitance ratio to be applied properly.
   4. Comparator checks with bit<1> reference level Vref1=RVC1*(¹⁄₆₄*Vref_msb+DVref1). DVref1=DVref7+DVref6c+DVref6+DVref5c+DVref5+DVref4c+DVref4+DVref 3 c+DVref3+DVref2c+DVref2+DVref1c.
      1. Bit<1> output is 1 if the level is higher, or the bit<1> output is 0.
      2. If <1>=1, The reference level is raised by DVref1=¹⁄₁₂₈*Vref_msb with capacitance ratio to be applied properly.
8. bit <0> MAC current is converted with TIA to be V<0> and associated bit<0> capacitor (¹⁄₁₂₈ size of MSB capacitor) is charged up to V<0>.
   1. <0> capacitor is connected to <7>, <6>, <5>, <4>, <3>, <2>, <1> capacitors to redistribute charge.
   2. Reference level is adjusted for added capacitance with ratio RVC0=1/(1+½+¼+⅛+¹⁄₁₆+¹⁄₃₂+¹⁄₆₄+¹⁄₁₂₈)=128/255
   3. The co<0> reference level is Vref0c=(¹⁄₆₄*Vref_msb+DVref0cs)*RVC0=128/255*(¹⁄₆₄*Vref_msb+Dvref0cs). Where, DVref0cs=DVref7+DVref6c+DVref6+DVref5c+DVref5+DVref4c+DVref4+DVr ef3c+DVref3+DVref2c+DVref2+DVref1c+DVref1.
      1. comparator checks redistributed level to Vref0c.
      2. co<0>=1 if redistributed level is higher, or co<0>=0.
      3. If co<0>=1, The reference level is raised by DVref0c=¹⁄₁₂₈*Vref_msb with capacitance ratio to be applied properly.
   4. Comparator checks with bit<0> reference level Vref0=RVC0*(¹⁄₁₂₈*Vref_msb+DVref0). DVref0=DVref7+DVref6c+DVref6+DVref5 c+DVref5+DVref4c+DVref4+DVref 3 c+DVref3+DVref2c+DVref2+DVref1c+DVref1+DVref0c.
      1. Bit<0> output is 1 if the level is higher, or the bit<0> output is 0.

What is claimed is:

1. A method for performing a successive binary-weighted digital-to-analog conversion, the method comprising:
   sequentially performing a first vector-matrix multiplication operation for each bit-order of values in an input vector, wherein the first vector-matrix multiplication operation for each bit-order generates an analog output;
   for each analog output generated by the vector-matrix multiplication operation:
      converting the analog output into one or more digital bit values;
      sending the one or more digital bit values to a second vector-matrix multiplication operation.

2. The method of claim 1, wherein the first vector-matrix multiplication operation is performed beginning with a most significant bit (MSB) of each of the values in the input vector and ending with a least significant bit (LSB) of each of the values in the input vector.

3. The method of claim 1, wherein converting the analog output into one or more digital bit values comprises:
   comparing the analog output to a reference signal, wherein a first digital bit value in the one or more digital bit values represents a logic 1 when the analog output is greater than the reference signal, and wherein the first digital bit value represents a logic 0 when the analog output is less than the reference signal.

4. The method of claim 3, wherein converting the analog output into one or more digital bit values further comprises:
   adjusting the reference signal when the first digital bit value represents a logic 1.

5. The method of claim 3, wherein:
   the analog output corresponds to an MSB of each of the values in the input vector; and
   the one or more digital bit values comprises the first digital bit value without a carryover bit.

6. The method of claim 4, wherein converting the analog output into one or more digital bit values further comprises:
   comparing the analog output to the reference signal after the reference signal is adjusted, wherein a second digital bit value in the one or more digital bit values represents a logic 1 when the analog output is greater than the reference signal, and wherein the second digital bit value represents a logic 0 when the analog output is less than the reference signal.

7. The method of claim 6, wherein:
   the first digital bit value represents a value corresponding to a current analog output; and
   the second digital bit value represents a carryover value to be added to a value corresponding to a previous analog output.

8. The method of claim 3, wherein converting the analog output into one or more digital bit values further comprises:
   maintaining the reference signal when the first digital bit value represents a logic 0.

9. The method of claim 8, wherein converting the analog output into one or more digital bit values further comprises:
   comparing the analog output to the reference signal after the reference signal is adjusted, wherein a second digital bit value in the one or more digital bit values represents a logic 1 when the analog output is greater than the reference signal, and wherein the second digital bit value represents a logic 0 when the analog output is less than the reference signal.

10. The method of claim 1, wherein there is a two cycle delay between converting the analog output into the one or more digital bit values and sending the one or more digital bit values to the second vector-matrix multiplication operation.

11. A vector-matrix multiplier circuit, comprising:
   a plurality of digital inputs, wherein each digital input receives a binary-encoded input value of an input vector;
   a vector matrix multiplier circuit that performs binary-encoded vector multiplication operations on a single bit-order at a time using the binary-encoded input value;
   a successive binary-weighted analog-to-digital converter that sequentially receives analog outputs from the vector matrix multiplier circuit, and sequentially converts each of the analog outputs into one or more digital bit values.

12. The vector-matrix multiplier circuit of claim 11, wherein the successive binary-weighted analog-to-digital converter comprises:
   a charge integration circuit comprising a capacitor on which each of the analog outputs stores charge on the capacitor.

13. The vector-matrix multiplier circuit of claim 11, wherein the vector matrix multiplier circuit also passes an indication of a current bit-order.

14. The vector-matrix multiplier circuit of claim 13, further comprising a multiplexor that sends the one or more digital bit values to one of a plurality of registers, wherein the indication of a current bit-order controls the multiplexor.

15. The vector-matrix multiplier circuit of claim 11, wherein the successive binary-weighted analog-to-digital converter comprises:
   a plurality of binary-weighted switches and capacitors that each store different ones of the analog outputs.

16. An apparatus for performing vector-matrix multiplication, the apparatus comprising:
   a means for receiving a plurality of digital inputs, wherein each digital input receives a binary-encoded input value of an input vector;
   a means for sequentially performing a vector-matrix multiplication operation for each bit-order of a plurality of input vector values, wherein the vector-matrix multiplication operation for each bit-order generates an analog output; and
   a means for converting each of the analog outputs into one or more digital bit values.

17. The apparatus for performing vector-matrix multiplication of claim 16, further comprising a successive binary-weighted analog-to-digital converter that sequentially receives analog outputs from the means for sequentially performing a vector-matrix multiplication operation, and sequentially converts each of the analog outputs into at least on digital bit value.

18. The apparatus for performing vector-matrix multiplication of claim 16, further comprising:
   a means for converting the plurality of digital inputs into a plurality of analog signals that are input into the means for sequentially performing a vector-matrix multiplication operation.

19. The apparatus for performing vector-matrix multiplication of claim 16, further comprising a voltage reference to which the analog output is compared.

20. The apparatus for performing vector-matrix multiplication of claim 19, further comprising a means for comparing the voltage reference to the analog output.

* * * * *